(12) United States Patent
Go et al.

(10) Patent No.: US 11,943,916 B2
(45) Date of Patent: Mar. 26, 2024

(54) SEMICONDUCTOR DEVICE INCLUDING DUMMY PILLAR AND ELECTRONIC SYSTEM

(71) Applicant: Samsung Electronics Co., Ltd., Suwon-si (KR)

(72) Inventors: Seongjae Go, Suwon-si (KR); Jongsoo Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 286 days.

(21) Appl. No.: 17/232,763

(22) Filed: Apr. 16, 2021

(65) Prior Publication Data
US 2022/0139943 A1  May 5, 2022

(30) Foreign Application Priority Data
Nov. 4, 2020 (KR) .................. 10-2020-0146048

(51) Int. Cl.
| | | |
|---|---|---|
| H10B 41/27 | (2023.01) | |
| H01L 23/528 | (2006.01) | |
| H10B 41/10 | (2023.01) | |
| H10B 41/35 | (2023.01) | |
| H10B 41/40 | (2023.01) | |
| H10B 43/10 | (2023.01) | |
| H10B 43/27 | (2023.01) | |
| H10B 43/35 | (2023.01) | |
| H10B 43/40 | (2023.01) | |

(52) U.S. Cl.
CPC ......... *H10B 41/27* (2023.02); *H01L 23/5283* (2013.01); *H10B 41/10* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02)

(58) Field of Classification Search
CPC ........ H10B 41/27; H10B 41/10; H10B 41/35; H10B 41/40; H10B 43/10; H10B 43/27; H10B 43/35; H10B 43/40; H10B 43/50; H01L 23/5283; H01L 24/05; H01L 25/0657
See application file for complete search history.

(56) References Cited

U.S. PATENT DOCUMENTS 9,831,180 B2  11/2017  Shingu et al.
10,685,975 B2  6/2020  Baek
(Continued)

FOREIGN PATENT DOCUMENTS

JP    2018163981 A   10/2018
KR    101609793 B1   4/2016

*Primary Examiner* — Fernando L Toledo
*Assistant Examiner* — Jahae Kim
(74) *Attorney, Agent, or Firm* — Muir Patent Law, PLLC

(57) ABSTRACT

A semiconductor device includes a stack structure including mold layers and horizontal conductive layers, which are alternately stacked. A channel structure vertically extending in the stack structure is provided. A pillar structure vertically extending in the stack structure is provided. A contact plug connected to a corresponding one of the horizontal conductive layers is disposed. The pillar structure includes a pillar extending through the horizontal conductive layers, and extensions protruding from a side surface of the pillar. Each extension is horizontally aligned with a corresponding one of the horizontal conductive layers.

18 Claims, 32 Drawing Sheets

(56) References Cited

U.S. PATENT DOCUMENTS

| | | |
|---|---|---|
| 2010/0202206 A1 | 8/2010 | Seol et al. |
| 2014/0145255 A1 | 5/2014 | Seol et al. |
| 2017/0213844 A1* | 7/2017 | Shin ................. H10B 43/27 |
| 2017/0221915 A1 | 8/2017 | Seol et al. |
| 2018/0197874 A1 | 7/2018 | Oshiki et al. |
| 2018/0226423 A1 | 8/2018 | Kang et al. |
| 2019/0386022 A1* | 12/2019 | Kim ................. H10B 43/27 |
| 2020/0051989 A1* | 2/2020 | Shimizu ............ H01L 23/52 |
| 2020/0152585 A1 | 5/2020 | Eom |
| 2021/0174839 A1* | 6/2021 | Lee ................. G11C 16/0483 |

\* cited by examiner

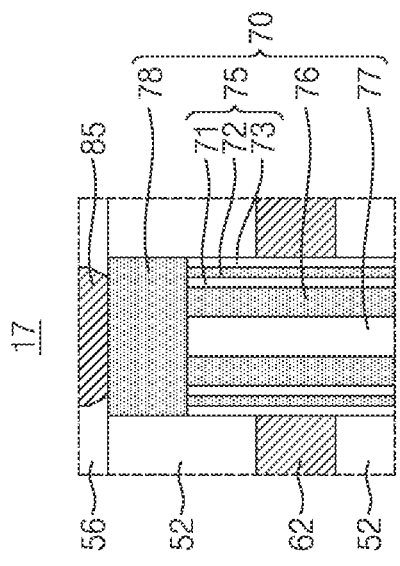
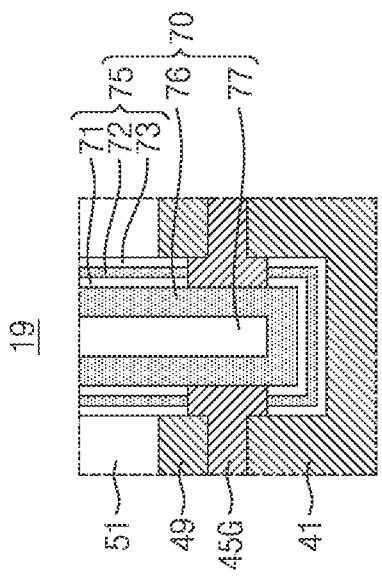
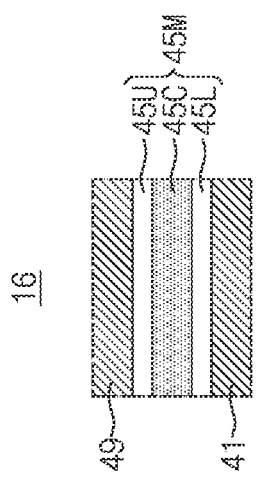
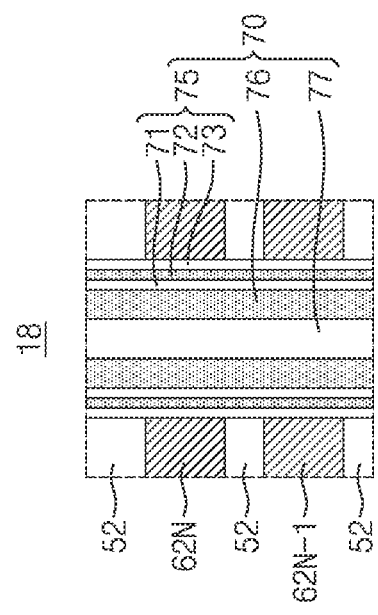

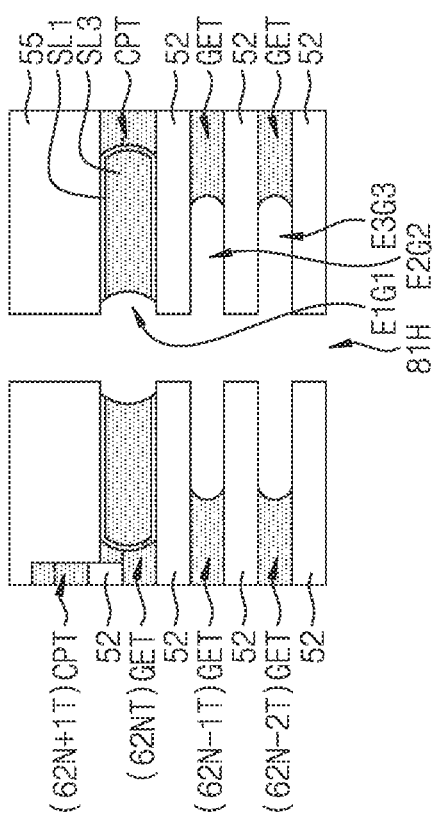
FIG. 31
FIG. 32
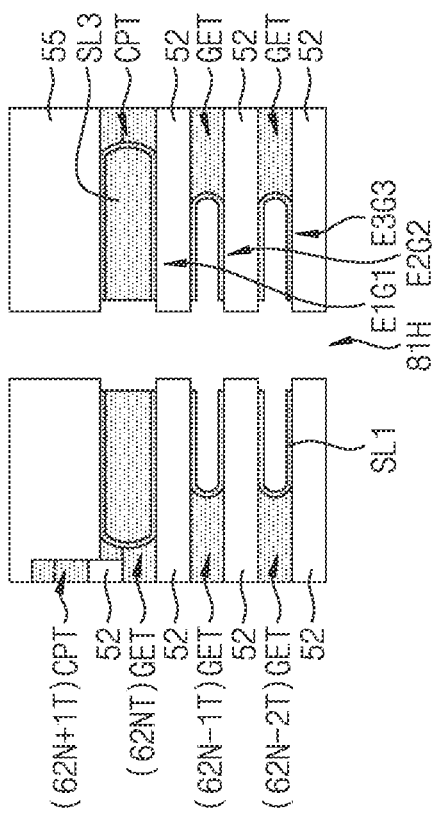
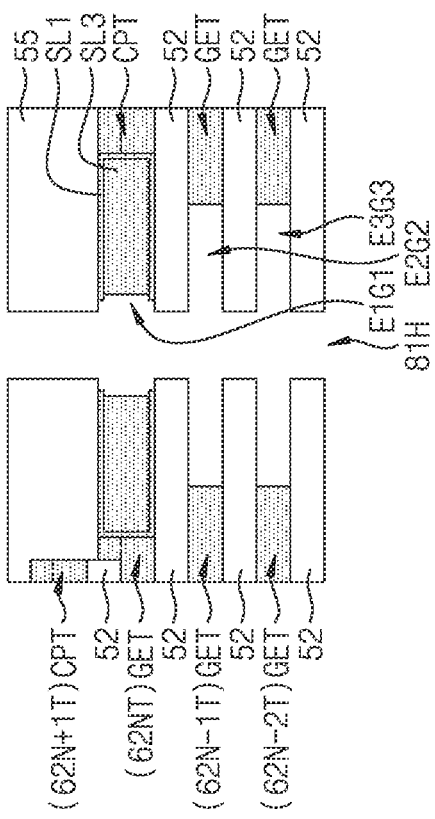
FIG. 33

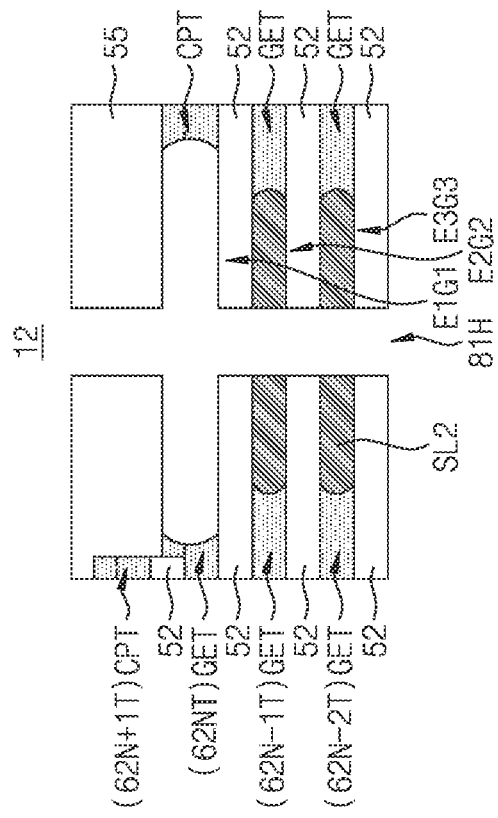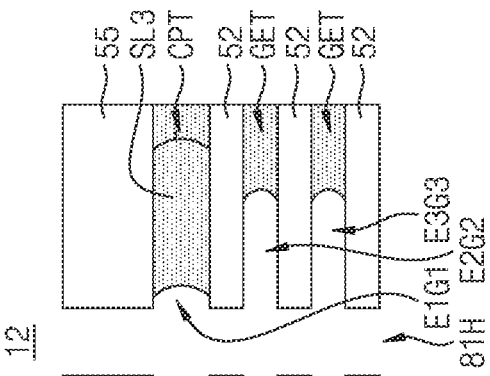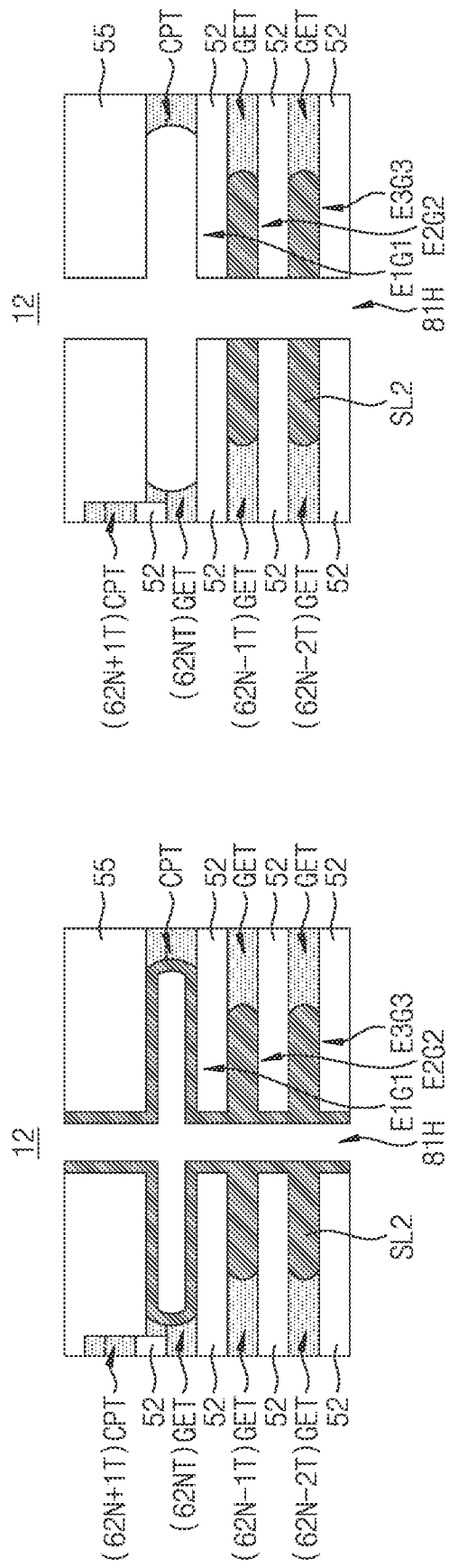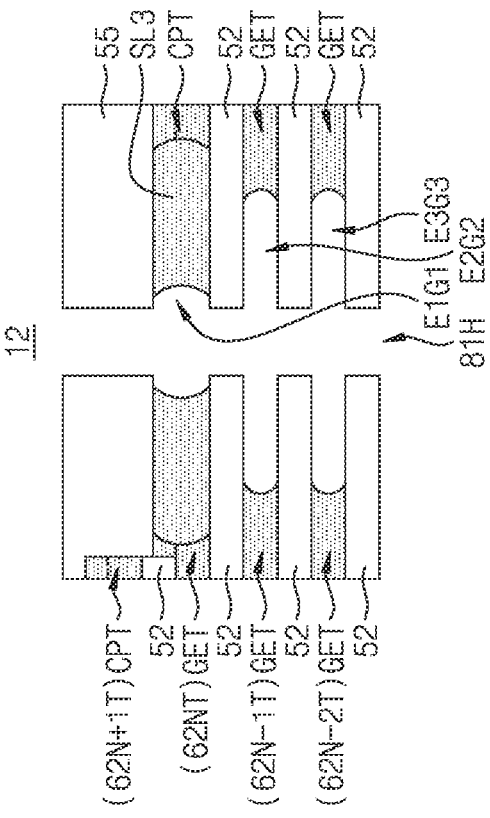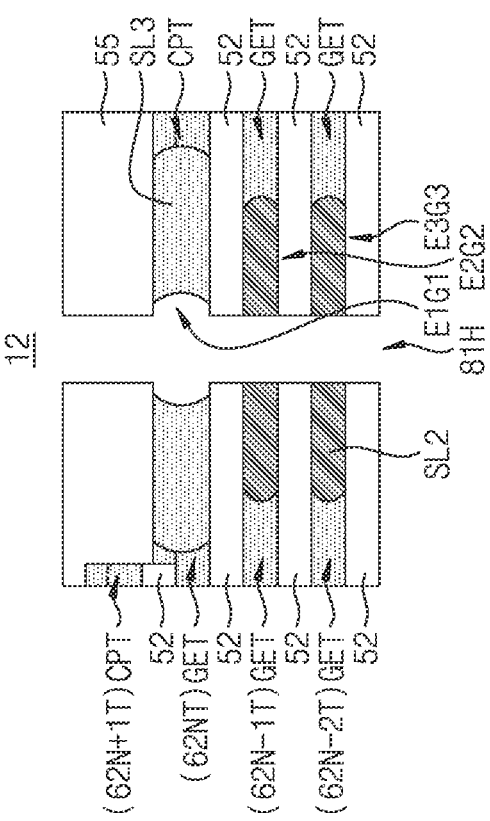

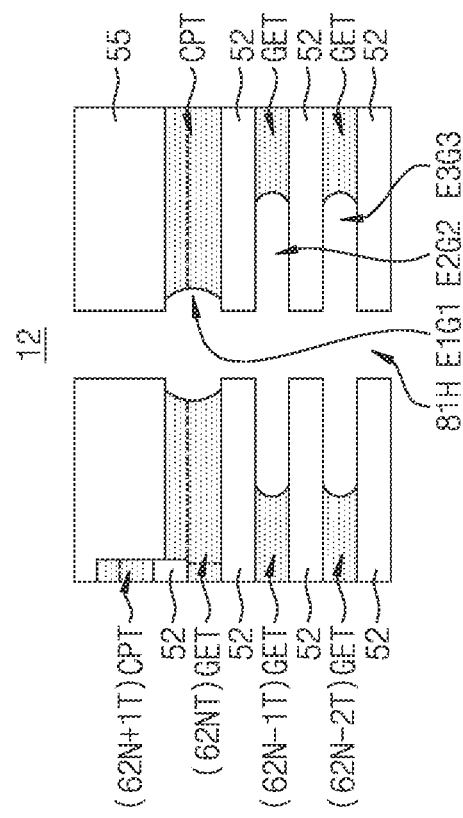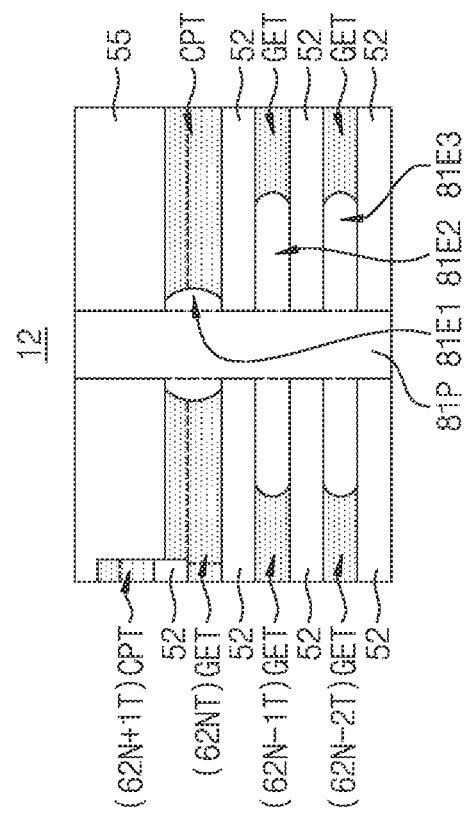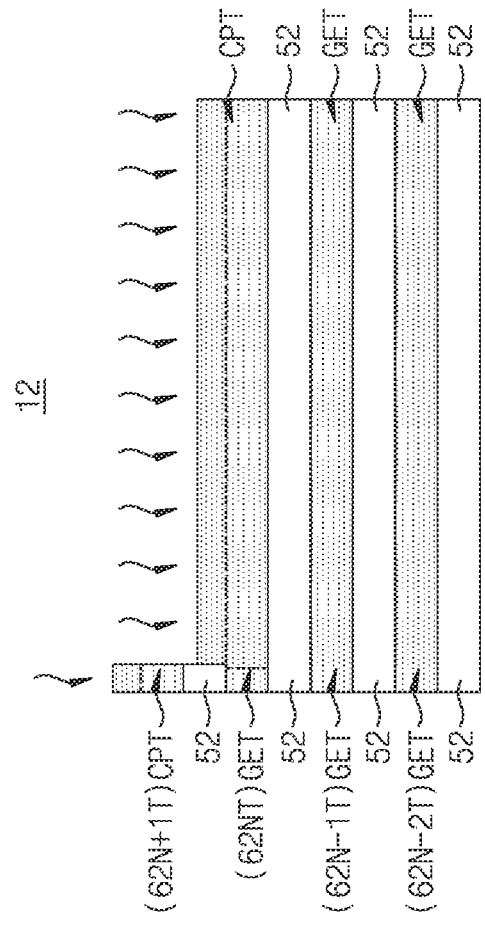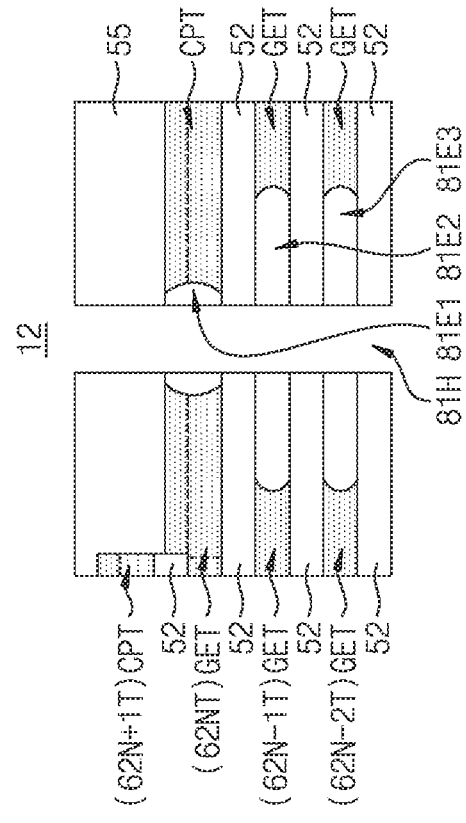

SEMICONDUCTOR DEVICE INCLUDING DUMMY PILLAR AND ELECTRONIC SYSTEM

CROSS-REFERENCE TO THE RELATED APPLICATION

This non-provisional patent application claims priority under 35 U.S.C. § 119 to Korean Patent Application No. 10-2020-0146048, filed on Nov. 4, 2020, in the Korean Intellectual Property Office, the disclosure of which is incorporated by reference herein in its entirety.

BACKGROUND

1. Field

The exemplary embodiments of the disclosure relate to a semiconductor device including a dummy pillar, an electronic system including the same, and a formation method thereof.

2. Description of the Related Art

In an electronic system requiring storage of data, a semiconductor device capable of storing large volumes of data is needed. Research on a scheme capable of increasing the data storage capacity of a semiconductor device is being conducted. For example, as one of methods for increasing the data storage capacity of a semiconductor device, a semiconductor device including three-dimensionally arranged memory cells in place of two-dimensionally arranged memory cells is proposed. A process for forming the three-dimensionally arranged memory cells becomes more and more difficult to implement.

SUMMARY

The exemplary embodiments of the disclosure provide semiconductor devices capable of preventing deformation of a multilayer structure, an electronic system including the same, and a formation method thereof.

A semiconductor device according to exemplary embodiments of the disclosure includes a stack structure including a plurality of mold layers and a plurality of horizontal conductive layers, which are alternately stacked. A channel structure vertically extending in the stack structure is provided. A pillar structure vertically extending in the stack structure is provided. A plurality of contact plugs, each being connected to a corresponding one of the plurality of horizontal conductive layers, are disposed. Each of the plurality of horizontal conductive layers includes a gate electrode, and a connecting pad in continuity with the gate electrode. The pillar structure includes a pillar extending through the plurality of horizontal conductive layers, and a plurality of extensions protruding from a side surface of the pillar. Each of the extensions is horizontally aligned with a corresponding one of the plurality of horizontal conductive layers. The channel structure vertically extends through a plurality of gate electrodes. Each of the contact plugs contacts a connecting pad of a corresponding one of the horizontal conductive layers.

A semiconductor device according to exemplary embodiments of the disclosure includes a substrate including a cell area and a connection area. A source line is disposed on the substrate. A stack structure including a plurality of mold layers and a plurality of horizontal conductive layers, which are alternately stacked, is provided on the source line. A channel structure vertically extending through the stack structure on the cell area and extending into the source line is provided. A pillar structure vertically extending through the stack structure on the connection area and extending into the source line is provided. A plurality of contact plugs disposed on the connection area, each contact plug being connected to a corresponding one of the plurality of horizontal conductive layers, are provided. Each of the plurality of horizontal conductive layers includes comprises a gate electrode, and a connecting pad in continuity with the gate electrode. The pillar structure includes a pillar extending through the plurality of horizontal conductive layers, and a plurality of extensions protruding from a side surface of the pillar. Each of the extensions is horizontally aligned with a corresponding one of the plurality of horizontal conductive layers. The channel structure vertically extends through a plurality of gate electrodes of the horizontal conductive layers. Each of contact plugs contacts a connecting pad of a corresponding one of the horizontal conductive layers. The stack structure is disposed on the cell region, and extends into the connection area.

An electronic system according to exemplary embodiments of the disclosure includes a semiconductor device, and a controller configured to control the semiconductor device. The semiconductor device includes a stack structure including a plurality of mold layers and a plurality of horizontal conductive layers, which are alternately stacked, a channel structure vertically extending in the stack structure, a pillar structure vertically extending in the stack structure, a plurality of contact plugs, each being connected to a corresponding one of the plurality of horizontal conductive layers, a plurality of peripheral circuits connected to the channel structure and the contact plugs, and an input/output pad electrically connected to at least one of the peripheral circuits. Each of the plurality of horizontal conductive layers includes a gate electrode, and a connecting pad in continuity with the gate electrode. The pillar structure includes a pillar extending through the plurality of horizontal conductive layers, and a plurality of extensions protruding from a side surface of the pillar. Each of the extensions is horizontally aligned with a corresponding one of the plurality of horizontal conductive layers. The channel structure extends through a plurality of gate electrodes of the horizontal conductive layers. Each contact plug contacts a connecting pad of a corresponding one of the horizontal conductive layers. The controller is electrically connected to the semiconductor device through the input/output pad.

BRIEF DESCRIPTION OF THE DRAWINGS

FIGS. 2 to 13 are enlarged views showing portions of FIG. 1, respectively.

FIGS. 17 to 58 are sectional views explaining formation methods of semiconductor devices according to exemplary embodiments of the disclosure.

DETAILED DESCRIPTION OF EXEMPLARY EMBODIMENTS

Figure 1:
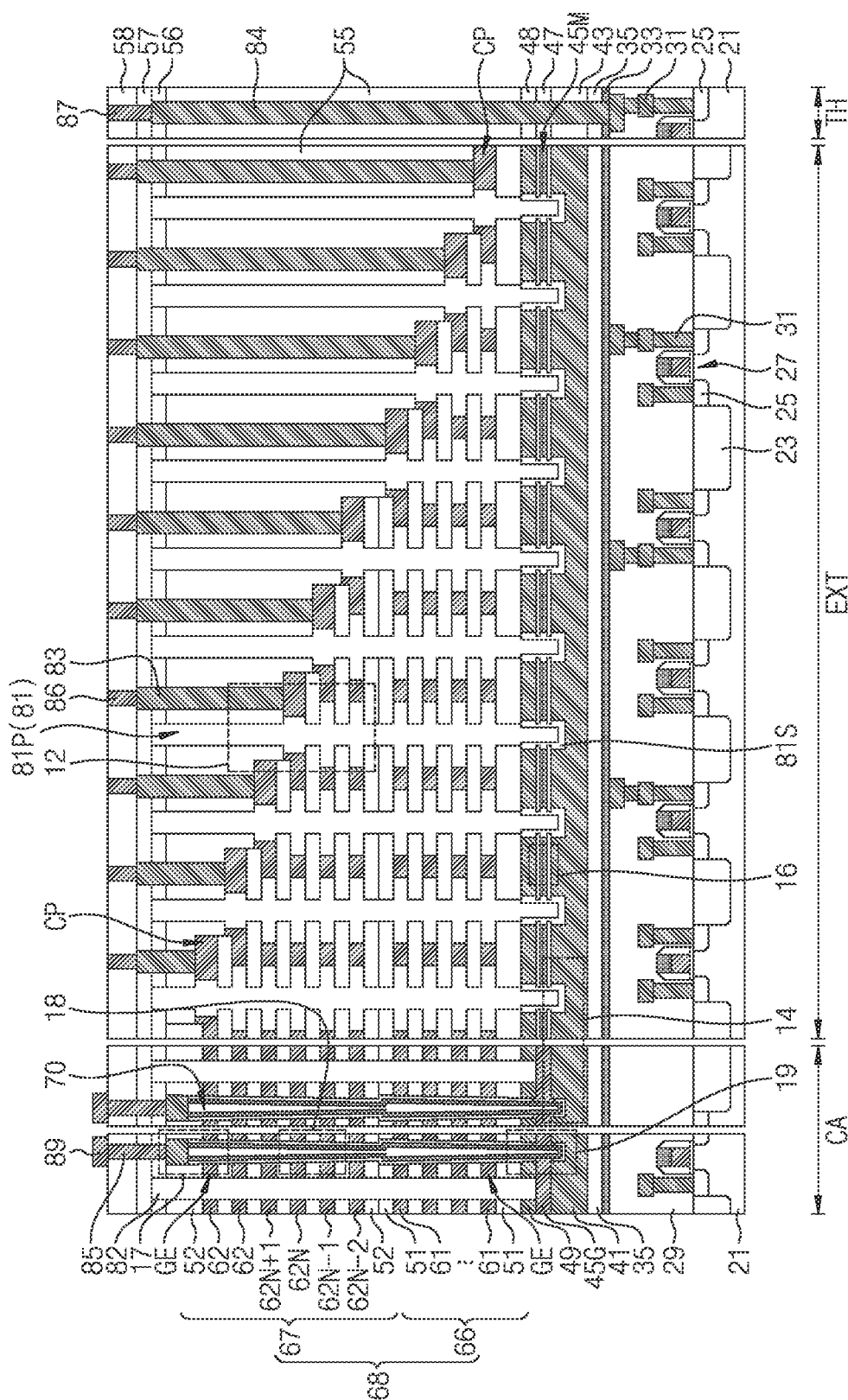
FIG. 1 is a sectional view explaining semiconductor devices according to exemplary embodiments of the disclosure.
Figure 7:
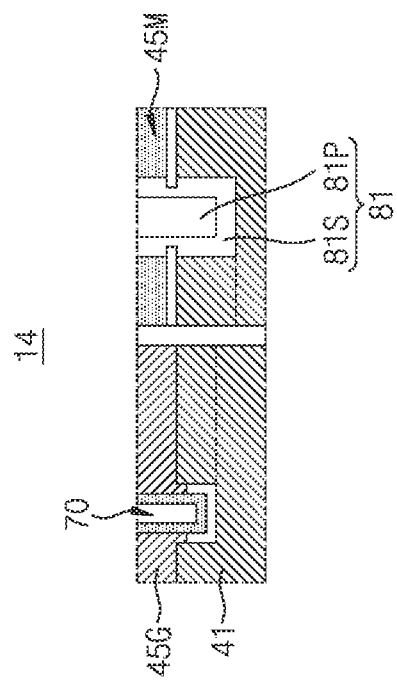
Figure 8:
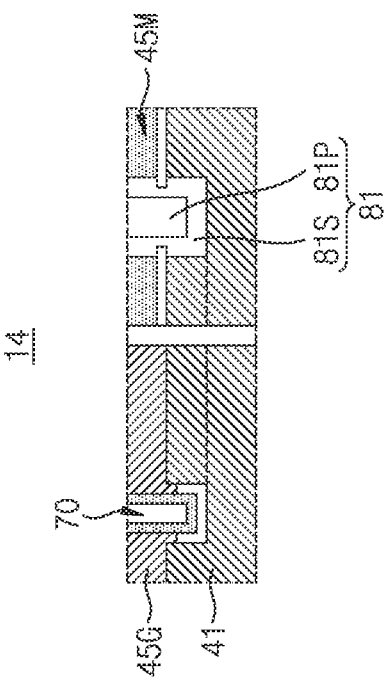
Figure 9:
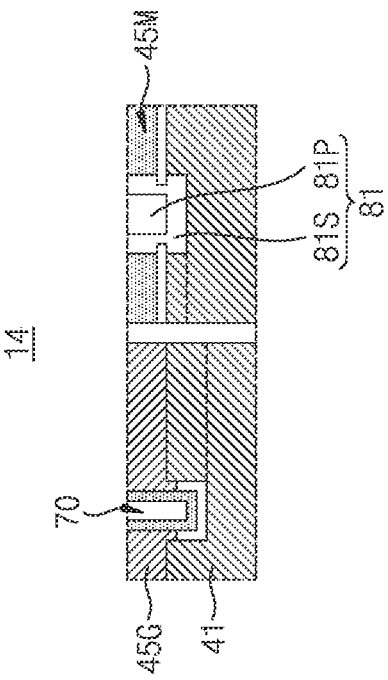

FIG. 1 is a sectional view explaining semiconductor devices according to exemplary embodiments of the disclosure. FIGS. 2 to 6 are enlarged views showing a portion 12 of FIG. 1. FIGS. 7 to 9 are enlarged views showing a portion 14 of FIG. 1. FIG. 10 is an enlarged view showing a portion 16 of FIG. 1. FIG. 11 is an enlarged view showing a portion 17 of FIG. 1. FIG. 12 is an enlarged view showing a portion 18 of FIG. 1. FIG. 13 is an enlarged view showing a portion 19 of FIG. 1. For example, the semiconductor devices according to the exemplary embodiments of the disclosure may include a non-volatile memory such as VNAND or 3D flash memory. The semiconductor devices according to the exemplary embodiments of the disclosure may include a cell-on-peripheral (COP) structure.

Referring to FIG. 1, the semiconductor devices according to the exemplary embodiments of the disclosure may include a substrate 21, an element isolation layer 23, a plurality of impurity regions 25, a plurality of transistors 27, a first insulating layer 29, a plurality of peripheral circuit wirings 31, a second insulating layer 33, a third insulating layer 35, a source line 41, a fourth insulating layer 43, a connecting electrode layer 45G, a connecting mold layer 45M, a fifth insulating layer 47, a sixth insulating layer 48, a supporter 49, a seventh insulating layer 55, an eighth insulating layer 56, a ninth insulating layer 57, a tenth insulating layer 58, a stack structure 68, a plurality of channel structures 70, a plurality of dummy pillars 81 (i.e., a plurality of pillar structures), a plurality of word line isolation patterns 82, a plurality of cell contact plugs 83, a through electrode 84, a plurality of bit plugs 85 (i.e., a plurality of bit line plugs), a plurality of first intermediate plugs 86, a second intermediate plug 87, and a plurality of bit lines 89.

The stack structure 68 may include a plurality of mold layers 51 and 52 and a plurality of horizontal conductive layers 61, 62N−2, 62N−1, 62N, 62N+1 and 62, which are alternately stacked on the substrate 21. The plurality of mold layers 51 and 52 may include a plurality of first mold layers 51 and a plurality of second mold layers 52. The plurality of horizontal conductive layers 61, 62N−2, 62N−1, 62N, 62N+1 and 62 may include a plurality of first horizontal conductive layers 61 and a plurality of second horizontal conductive layers 62N−2, 62N−1, 62N, 62N+1 and 62. Each of the plurality of horizontal conductive layers 61, 62N−2, 62N−1, 62N, 62N+1 and 62 may include a gate electrode GE and a connecting pad CP. The plurality of first mold layers 51 and the plurality of first horizontal conductive layers 61 may constitute a first stack structure 66. The plurality of second mold layers 52 and the plurality of second horizontal conductive layers 62N−2, 62N−1, 62N, 62N+1 and 62 may constitute a second stack structure 67.

The substrate 21 may include a cell area CA, a connection area EXT in continuity with a side surface of the cell area CA, and a through area TH adjacent to the cell area CA and the connection area EXT. The substrate 21 may include a semiconductor substrate such as a silicon wafer or a silicon-on-insulator (SOI) wafer. The element isolation layer 23 may be formed on the substrate 21. The plurality of impurity regions 25 may be formed in the substrate 21. Each of the plurality of impurity regions 25 may include or be doped with N-type impurities or P-type impurities.

The plurality of transistors 27 may be formed in the substrate 21 and/or on the substrate 21 in accordance with various methods. The plurality of transistors 27 may include a fin field effect transistor (FinFET), a multi-bridge channel transistor such as MBCFET®, a nanowire transistor, a vertical transistor, a recess channel transistor, a 3-D transistor, a planar transistor, or a combination thereof. The plurality of transistors 27 may include some of the plurality of impurity regions 25. Some of the plurality of impurity regions 25 may correspond to a drain region or a source region.

The first insulating layer 29 may be formed on the substrate 21 to cover the plurality of transistors 27 and the element isolation layer 23. The plurality of peripheral circuit wirings 31 may be formed in the first insulating layer 29. The plurality of peripheral circuit wirings 31 may include horizontal and vertical wirings having various shapes. Some of the plurality of peripheral circuit wirings 31 may contact the plurality of impurity regions 25. The plurality of transistors 27 and the plurality of peripheral circuit wirings 31 may constitute a peripheral circuit. The second insulating layer 33 may be formed on the first insulating layer 29 and the plurality of peripheral circuit wirings 31. The third insulating layer 35 may be formed on the second insulating layer 33. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The second insulating layer 33 may correspond to a capping layer or an etch stop layer. The second insulating layer 33 may include a material different from those of the first insulating layer 29 and the third insulating layer 35. For example, the second insulating layer 33 may include silicon nitride, silicon oxynitride, silicon boron nitride (SiBN), silicon carbon nitride (SiCN), or a combination thereof. The first insulating layer 29 and the third insulating layer 35 may include silicon oxide.

Each of the element isolation layer 23, the first insulating layer 29, the second insulating layer 33, the third insulating layer 35, the fourth insulating layer 43, the connecting mold layer 45M, the fifth insulating layer 47, the sixth insulating layer 48, the plurality of mold layers 51 and 52, the seventh insulating layer 55, the eighth insulating layer 56, the ninth insulating layer 57, the tenth insulating layer 58, the plurality of dummy pillars 81, and the plurality of word line isolation patterns 82 may include a single layer or multiple layers. Each of the element isolation layer 23, the first insulating layer 29, the second insulating layer 33, the third insulating layer 35, the fourth insulating layer 43, the connecting mold layer 45M, the fifth insulating layer 47, the sixth insulating layer 48, the plurality of mold layers 51 and 52, the seventh insulating layer 55, the eighth insulating layer 56, the ninth insulating layer 57, the tenth insulating layer 58, the plurality of dummy pillars 81, and the plurality of word line isolation patterns 82 may include silicon oxide, silicon nitride, silicon oxynitride, silicon boron nitride (SiBN), silicon carbon nitride (SiCN), low-k dielectrics, or high-k dielectrics (for example, metal oxide such as HfO or AlO, metal silicate such as HfSiO, etc.).

Each of the plurality of peripheral circuit wirings 31, the source line 41, the connecting electrode layer 45G, the supporter 49, the plurality of horizontal conductive layers 61, 62N−2, 62N−1, 62N, 62N+1 and 62, the plurality of cell contact plugs 83, the through electrode 84, the plurality of bit plugs 85, the plurality of first intermediate plugs 86, the second intermediate plug 87, and the plurality of bit lines 89 may include a single layer or multiple layers. Each of the plurality of peripheral circuit wirings 31, the source line 41, the connecting electrode layer 45G, the supporter 49, the plurality of horizontal conductive layers 61, 62N−2, 62N−1, 62N, 62N+1 and 62, the plurality of cell contact plugs 83, the through electrode 84, the plurality of bit plugs 85, the plurality of first intermediate plugs 86, the second intermediate plug 87, and the plurality of bit lines 89 may include a conductive material such as metal, metal nitride, metal oxide, metal silicide, conductive carbon, polysilicon, amorphous silicon, monocrystalline silicon, or a combination thereof.

The source line 41 and the fourth insulating layer 43 may be formed on the third insulating layer 35. The source line 41 may correspond to a common source line (CSL). The source line 41 may include a conductive layer such as a polysilicon layer or a monocrystalline semiconductor layer. The source line 41 may be disposed in the cell region CA and the connection area EXT on the substrate 21. The third insulating layer 35 may be disposed on the through area TH.

The connecting electrode layer 45G and the connecting mold layer 45M may be formed on the source line 41. The fifth insulating layer 47 may be formed on the fourth insulating layer 43. The supporter 49 may be formed on the connecting electrode layer 45G and the connecting mold layer 45M. The connecting electrode layer 45G and the connecting mold layer 45M may be formed at substantially the same level. The sixth insulating layer 48 may be formed on the fifth insulating layer 47. Upper surfaces of the supporter 49 and the sixth insulating layer 48 may be substantially coplanar with each other. The connecting electrode layer 45G may contact the source line 41. For example, the connecting electrode layer 45G may include a conductive layer such as a polysilicon layer. The supporter 49 may include or may be a polysilicon layer. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The stack structure 68, which includes the plurality of mold layers 51 and 52 and the plurality of horizontal conductive layers 61, 62N−2, 62N−1, 62N, 62N+1 and 62 stacked alternately, may be formed on the supporter 49. The stack structure 68 may be disposed in the cell area CA and the connection area EXT on the substrate 21. The gate electrode GE may be disposed in the cell region CA, and may extend into the connection area EXT. The connecting pad CP may be disposed in the connection area EXT, and may be in continuity with the gate electrode GE. The stack structure 68 may include a stepped shape in the connection area EXT on the substrate 21. For example, the connecting pads CP may be at the ends of the horizontal conductive layers 61, 62N−2, 62N−1, 62N, 62N+1 and 62 without vertically overlapping each other to provide connection sites where each horizontal conductive layer is connected to a corresponding cell contact plug 83. The seventh insulating layer 55 may be formed to cover the stack structure 68 in the connection area EXT and the sixth insulating layer 48. The seventh insulating layer 55 may contact an upper surface of the connecting pad CP and/or a side surface of the connecting pad CP. The stack structure 68 may be disposed in the cell region CA on the substrate 21, and may extend on the connection area EXT. The connecting pad CP may be referred to as a "raised pad".

The plurality of channel structures 70 may be formed to extend into the source line 41 while extending through the stack structure 68, the supporter 49 and the connecting electrode layer 45G. The plurality of channel structures 70 may extend through the gate electrode GE. The plurality of channel structures 70 may be disposed in the cell region CA on the substrate 21. Upper surfaces of the stack structure 68, the plurality of channel structures 70 and the seventh insulating layer 55 may be substantially coplanar as each other. The eighth insulating layer 56 may be formed on the stack structure 68, the plurality of channel structures 70 and the seventh insulating layer 55.

The plurality of dummy pillars 81 may be formed to extend into the source line 41 while extending through the eighth insulating layer 56, the seventh insulating layer 55, the stack structure 68, the supporter 49 and the connecting mold layer 45M. The plurality of dummy pillars 81 may be disposed in the connection area EXT on the substrate 21. Each of the plurality of dummy pillars 81 (i.e., the plurality of pillar structures) may include an inactive pillar 81P (i.e., a pillar) extending through the stack structure 68 while having a greater vertical height than a horizontal width, and a stud 81S formed in the supporter 49, the connecting mold layer 45M and the source line 41. The stud 81S may surround a lower surface of the inactive pillar 81P and a side surface of the inactive pillar 81P. For example, the inactive pillar 81P may include or may be formed of silicon oxide. The stud 81S may include or may be formed of silicon oxide, silicon oxynitride, or a combination thereof. For example, the inactive pillar 81P and the stud 81S may be formed of the same material as each other. The present inventive concept is not limited thereto. For example, the inactive pillar 81P and the stud 81S may be formed of insulating materials different from each other. The plurality of dummy pillars 81 may serve to provide a structural support with the plurality of horizontal conductive layers 61, 62N−2, 62N−1, 62N, 62N+1 and 62 stacked alternately on the substrate 21. For example, the dummy pillars 81 may prevent the plurality of horizontal conductive layers 61, 62N−2, 62N−1, 62N, 62N+1 and 62 from collapsing down while a semiconductor device is being processed, and the plurality of horizontal conductive layers 61, 62N−2, 62N−1, 62N, 62N+1 and 62 in the connection area EXT may be more securely in place.

The through electrode 84 may be formed to extend through the eighth insulating layer 56, the seventh insulating layer 55, the sixth insulating layer 48, the fifth insulating layer 47, the fourth insulating layer 43, the third insulating layer 35, and the second insulating layer 33 such that the through electrode 84 contacts a corresponding one of the plurality of peripheral circuit wirings 31. The word line isolation pattern 82 may be formed to extend through the eighth insulating layer 56, the stack structure 68, and the supporter 49. The ninth insulating layer 57 may be formed on the eighth insulating layer 56, the word line isolation pattern 82, and the through electrode 84.

The plurality of cell contact plugs 83 may be formed to extend through the ninth insulating layer 57, the eighth insulating layer 56, and the seventh insulating layer 55 such that the plurality of cell contact plugs 83 contacts the plurality of horizontal conductive layers 61, 62N−2, 62N−1, 62N, 62N+1 and 62. The plurality of cell contact plugs 83 may be disposed in the connection area EXT on the substrate 21. Each of the plurality of cell contact plugs 83 may contact a corresponding connecting pad CP. Each of the plurality of cell contact plugs 83 may electrically contact a corresponding one of the plurality of horizontal conductive layers 61, 62N−2, 62N−1, 62N, 62N+1 and 62. Each of the plurality of cell contact plugs 83 may be referred to as a "contact plug".

The tenth insulating layer 58 may be formed on the ninth insulating layer 57. The plurality of bit plugs 85 may be formed to extend through the tenth insulating layer 58, the ninth insulating layer 57, and the eighth insulating layer 56 such that each of the plurality of bit plugs 85 contacts a corresponding one of the plurality of channel structures 70. The plurality of bit lines 89 may be formed on the tenth insulating layer 58 to contact the plurality of bit plugs 85. The plurality of first intermediate plugs 86 may be formed to extend through the tenth insulating layer 58 such that each of the plurality of first intermediate plugs 86 contacts a corresponding one of the plurality of cell contact plugs 83. The second intermediate plug 87 may be formed to extend through the tenth insulating layer 58 and the ninth insulating layer 57 such that the second intermediate plug 87 contacts the through electrode 84.

At least one of the plurality of horizontal conductive layers 61, 62N−2, 62N−1, 62N, 62N+1 and 62, which is disposed adjacent to a lower surface of the stack structure 68, may correspond to a ground selection line. At least one of the plurality of horizontal conductive layers 61, 62N−2, 62N−1, 62N, 62N+1 and 62, which is disposed adjacent to the upper surface of the stack structure 68, may correspond to a string selection line. Some of the plurality of horizontal conductive layers 61, 62N−2, 62N−1, 62N, 62N+1 and 62 may correspond to a word line.

Figure 2:
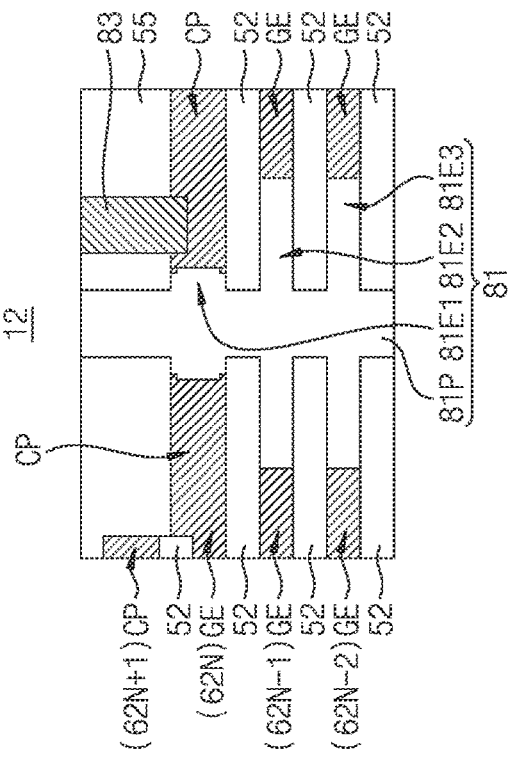

Referring to FIG. 2, the plurality of second horizontal conductive layers 62N−2, 62N−1, 62N, 62N+1 and 62 may include an N−2-th conductive layer 62N−2, an N−1-th conductive layer 62N−1, an N-th conductive layer 62N, and an N+1-th conductive layer 62N+1. Each of the plurality of second horizontal conductive layers 62N−2, 62N−1, 62N, 62N+1 and 62 may include the gate electrode GE, and the connecting pad CP in continuity with the gate electrode GE. The horizontal width of the gate electrode GE may be greater than the vertical thickness of the gate electrode GE. The vertical thickness of the connecting pad CP may be greater than the vertical thickness of the gate electrode GE. The plurality of second mold layers 52 may be disposed among the plurality of second horizontal conductive layers 62N−2, 62N−1, 62N, 62N+1 and 62. The seventh insulating layer 55 may contact the upper and side surfaces of the connecting pad CP.

The dummy pillar 81 (i.e., the pillar structure) may include an inactive pillar 81P (i.e., a pillar), and a plurality of extensions 81E1, 81E2 and 81E3. The plurality of extensions 81E1, 81E2 and 81E3 may include a first extension 81E1, a second extension 81E2, and a third extension 81E3. The inactive pillar 81P may extend through the seventh insulating layer 55, the connecting pad CP of the N-th conductive layer 62N, the gate electrode GE of the N−1-th conductive layer 62N−1, the gate electrode GE of the N−2-th conductive layer 62N−2, and the plurality of second mold layers 52. The horizontal height of the inactive pillar 81P may be greater than the vertical height of the inactive pillar 81P.

Each of the first extension 81E1, the second extension 81E2 and the third extension 81E3 may protrude from a side surface of the inactive pillar 81P. Each of the first extension 81E1, the second extension 81E2 and the third extension 81E3 may be materially in continuity with the side surface of the inactive pillar 81P. For example, the first extension 81E1, the second extension 81E2, and the third extension 81E3 may include substantially the same material layer. For example, the first extension 81E1, the second extension 81E2 and the third extension 81E3 may include silicon oxide, silicon oxynitride, or a combination thereof.

The first extension 81E1 may be horizontally aligned with the connecting pad CP of the N-th conductive layer 62N to be at the same vertical height above the substrate. The first extension 81E1 may have substantially the same vertical thickness as the connecting pad CP of the N-th conductive layer 62N. A side surface of the first extension 81E1 may contact the side surface of the connecting pad CP. The horizontal width of the first extension 81E1 may be smaller than the vertical thickness of the first extension 81E1.

The second extension 81E2 may be spaced apart from the first extension 81E1. The second extension 81E2 may be horizontally aligned with the gate electrode GE of the N-th conductive layer 62N−1 to be at the same vertical height above the substrate. A corresponding one of the plurality of second mold layers 52 may be disposed between the first extension 81E1 and the second extension 81E2. The second extension 81E2 may have substantially the same vertical thickness as the gate electrode GE of the N−1-th conductive layer 62N−1. The vertical thickness of the second extension 81E2 may be smaller than the vertical thickness of the first extension 81E1.

A side surface of the second extension 81E2 may contact a side surface of the gate electrode GE. The horizontal width of the second extension 81E2 may be greater than the vertical thickness of the second extension 81E2. The horizontal width of the second extension 81E2 may be greater than the horizontal width of the first extension 81E1. A portion of the second extension 81E2 may vertically overlap with the connecting pad CP of the N-th conductive layer 62N. A corresponding one of the plurality of second mold layers 52 may be disposed between the second extension 81E2 and the connecting pad CP.

The third extension 81E3 may be spaced apart from the second extension 81E2. The third extension 81E3 may be horizontally aligned with the gate electrode GE of the N−2-th conductive layer 62N−2 to be at the same vertical height above the substrate. A portion of the third extension 81E3 may vertically overlap the connecting pad CP of the N-th conductive layer 62N. A corresponding one of the plurality of second mold layers 52 may be disposed between the third extension 81E3 and the second extension 81E2. The third extension 81E3 may have substantially the same vertical thickness as the gate electrode GE of the N−2-th conductive layer 62N−2. A side surface of the third extension 81E3 may contact the side surface of the gate electrode GE. The horizontal width of the third extension 81E3 may be greater than the vertical thickness of the third extension 81E3. The horizontal width of the third extension 81E3 may be greater than the horizontal width of the first extension 81E1. The horizontal width of the third extension 81E3 may be substantially equal to the horizontal width of the second extension 81E2.

Each of the first extension 81E1, the second extension 81E2 and the third extension 81E3 may have a round side surface. For example, each of the first extension 81E1, the second extension 81E2, and the third extension 81E3 may have a convex side surface which curves outward away from the inactive pillar 81P. Each of the first extension 81E1, the second extension 81E2 and the third extension 81E3 may have a smaller horizontal width at an upper surface thereof than at a central portion thereof. Each of the first extension 81E1, the second extension 81E2 and the third extension 81E3 may have a greater horizontal width at a lower surface thereof than at the central portion thereof.

The cell contact plug 83 may extend through the seventh insulating layer 55 such that the cell contact plug 83 contacts the connecting pad CP of the N-th conductive layer 62N. The cell contact plug 83 may extend into the connecting pad CP. The cell contact plug 83 may be spaced apart from the first extension 81E1. A portion of the second extension 81E2 may overlap with the cell contact plug 83.

Figure 3:
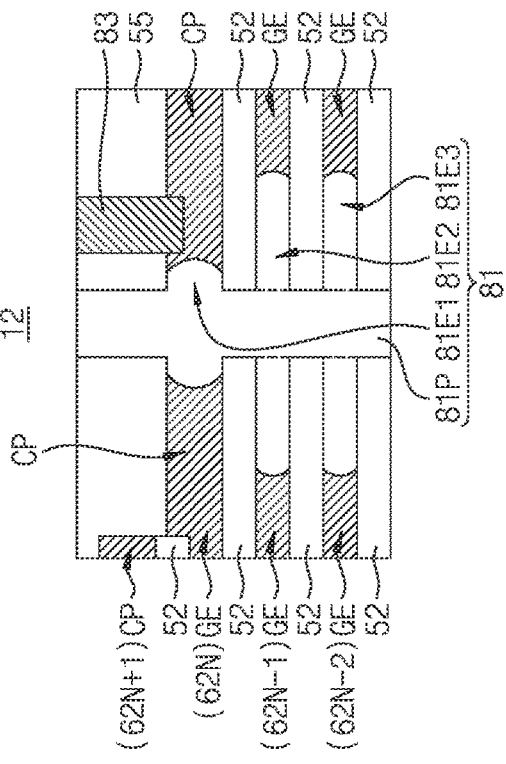

Referring to FIG. 3, each of the first extension 81E1, the second extension 81E2 and the third extension 81E3 may have a side surface having various shapes. Each of the second extension 81E2 and the third extension 81E3 may have a side surface having a shape different from that of the first extension 81E1. For example, the surface of the first extension 81E1 may include a stepped shape.

Figure 4:
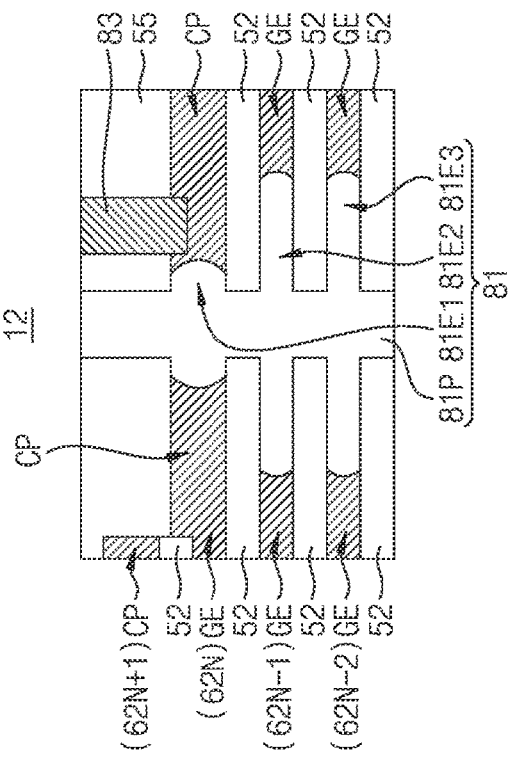

Referring to FIG. 4, the cell contact plug 83 may extend into the second extension 81E2 while extending through the seventh insulating layer 55, the connecting pad CP of the N-th conductive layer 62N, and a corresponding one of the plurality of second mold layers 52. The cell contact plug 83 may be spaced apart from the first extension 81E1. The cell contact plug 83 may contact the connecting pad CP.

Figure 5:
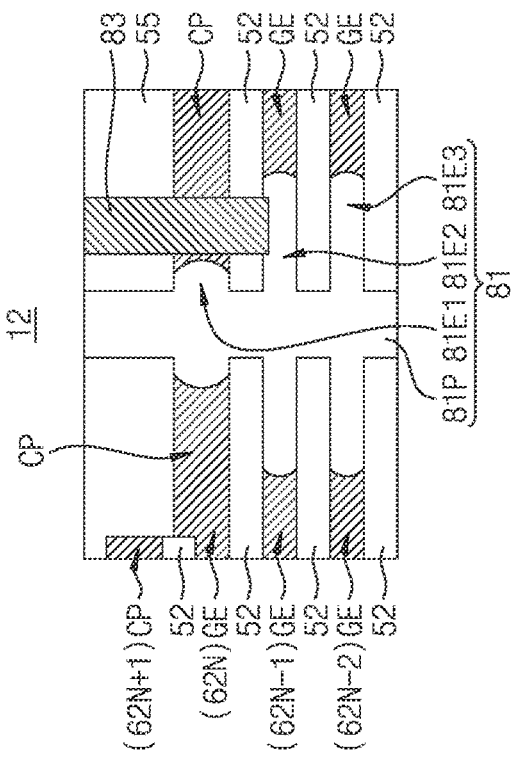

Referring to FIG. 5, at least some of the first extension 81E1, the second extension 81E2 and the third extension 81E3 may include a material different from that of the inactive pillar 81P. For example, the inactive pillar 81P may include or may be formed of silicon oxide, and the second extension 81E2 and the third extension 81E3 may include or may be formed of silicon oxynitride.

For example, the first extension 81E1 may include a material different from those of the second extension 81E2 and the third extension 81E3. The first extension 81E1 may include or may be formed of silicon oxide, whereas the second extension 81E2 and the third extension 81E3 may include or may be formed of silicon oxynitride.

For example, the inactive pillar 81P and the first extension 81E1 may include or may be formed of silicon oxide, whereas the second extension 81E2 and the third extension 81E3 may include or may be formed of silicon oxynitride.

Figure 6:
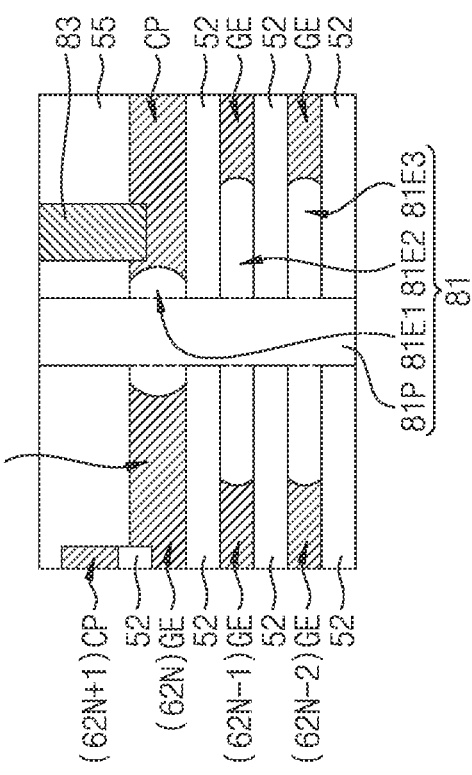

Referring to FIG. 6, the first extension 81E1, the second extension 81E2 and the third extension 81E3 may include a material different from that of the inactive pillar 81P. The first extension 81E1 may include a material different from those of the second extension 81E2 and the third extension 81E3. For example, the inactive pillar 81P may include or may be formed of silicon oxide, the first extension 81E1 may include or may be formed of SiBON, and the second extension 81E2 and the third extension 81E3 may include or may be formed of silicon oxynitride.

Referring to FIG. 7, the dummy pillar 81 may include the inactive pillar 81P and the stud 81S. A lowermost end of the dummy pillar 81 may be disposed at a level different from that of a lowermost end of the channel structure 70. The lowermost end of the dummy pillar 81 may be formed at a lower level than the lowermost end of the channel structure 70.

Referring to FIG. 8, the lowermost end of the dummy pillar 81 may be formed at a higher level than the lowermost end of the channel structure 70.

Referring to FIG. 9, the lowermost end of the dummy pillar 81 may be formed at substantially the same level as the lowermost end of the channel structure 70.

Referring to FIG. 10, the connecting mold layer 45M may include a lower mold layer 45L, an upper mold layer 45U on the lower mold layer 45L, and an intermediate mold layer 45C between the lower mold layer 45L and the upper mold layer 45U. The intermediate mold layer 45C may include a material having etch selectivity with respect to the lower mold layer 45L and the upper mold layer 45U. For example, each of the lower mold layer 45L and the upper mold layer 45U may include or may be formed of silicon oxide. The intermediate mold layer 45C may include or may be formed of silicon nitride.

Referring to FIG. 11, the channel structure 70 may include a core pattern 77, a channel layer 76 surrounding an outside of the core pattern 77, an information storage pattern 75 surrounding an outside of the channel layer 76, and a bit pad 78 (i.e., a bit line pad) on the channel layer 76. The information storage pattern 75 may include a tunnel insulating layer 71 surrounding the outside of the channel layer 76, a charge storage layer 72 surrounding an outside of the tunnel insulating layer 71, and a blocking layer 73 surrounding an outside of the charge storage layer 72. The channel structure 70 may extend through the second horizontal layer 62 and the plurality of second mold layers 52. The bit plug 85 may extend through the eighth insulating layer 56 such that the bit plug 85 contacts the bit pad 78.

The tunnel insulating layer 71 may include an insulating layer such as silicon oxide. The charge storage layer 72 may include an insulating layer such as silicon nitride. The blocking layer 73 may include an insulating layer made of silicon oxide, silicon nitride, silicon oxynitride, high-k dielectrics (for example, metal oxide such as HfO, AlO, or a combination thereof, or metal silicate such as HfSiO), or a combination thereof. The channel layer 76 may include a semiconductor layer made of polysilicon, amorphous silicon, monocrystalline silicon, or a combination thereof. The core pattern 77 may include silicon oxide, silicon nitride, silicon oxynitride, low-k dielectrics, high-k dielectrics, polysilicon, or a combination thereof. The bit pad 78 may include a conductive layer made of metal, metal nitride, metal oxide, metal silicide, conductive carbon, polysilicon, or a combination thereof.

Referring to FIG. 12, the channel structure 70 may extend through the plurality of second mold layers 52, the N-th conductive layer 62N, and the N–1-th conductive layer 62N–1.

Referring to FIG. 13, the connecting electrode layer 45G may be disposed between the source line 41 and the supporter 49. The first mold layer 51 may be disposed on the supporter 49. The channel structure 70 may extend into the source line 41 while extending through the first mold layer 51, the supporter 49, and the connecting electrode layer 45G. The connecting electrode layer 45G may extend through a side surface of the information storage pattern 75 such that the connecting electrode layer 45G contacts a side surface of the channel layer 76. A lowermost end of the channel structure 70 may be disposed at a higher level than a lower surface of the source line 41. The channel layer 76 may be electrically connected to the source line 41 via the connecting electrode layer 45G.

Figure 14:
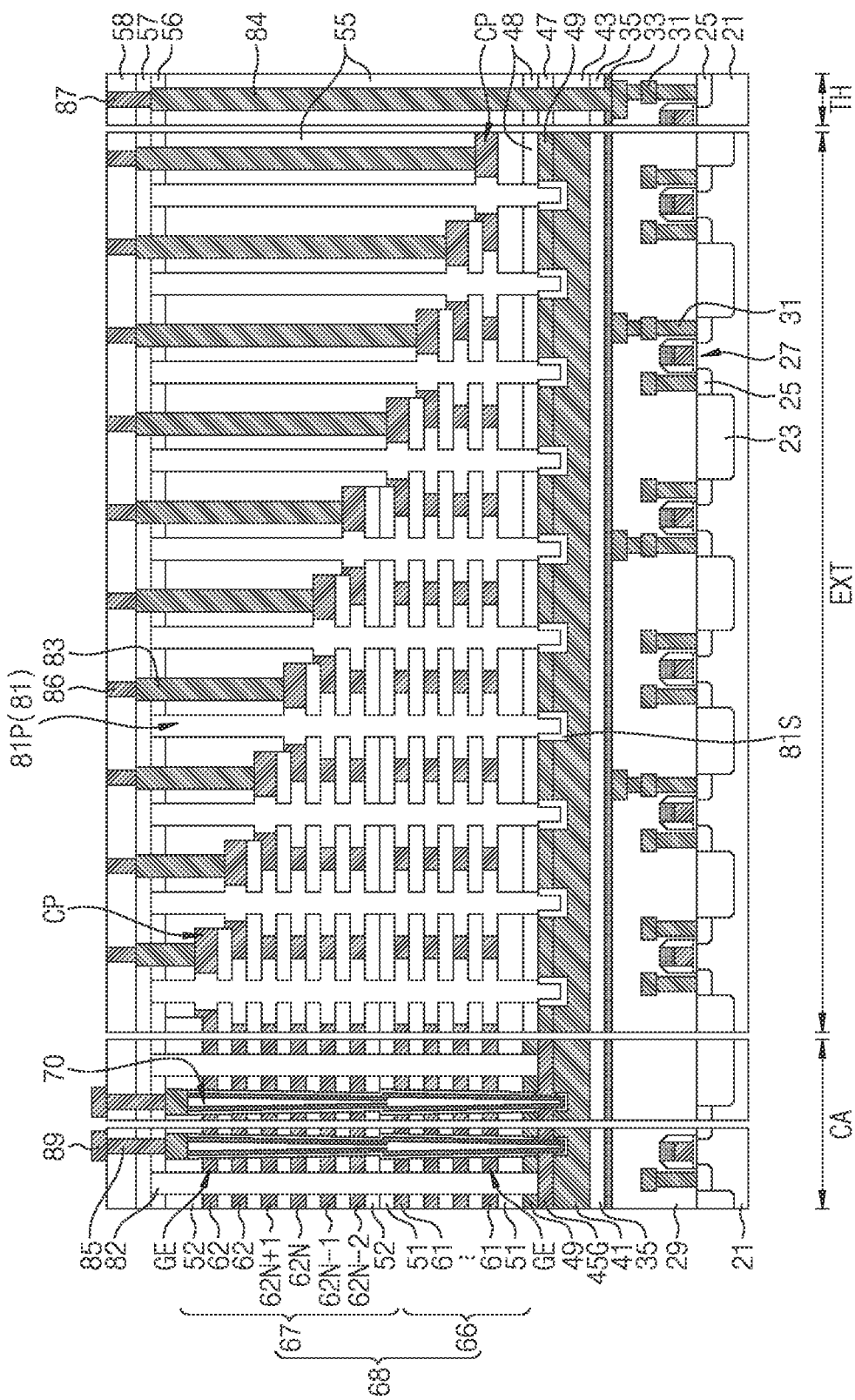
FIGS. 14 to 16 are sectional views explaining semiconductor devices according to exemplary embodiments of the disclosure.
Figure 15:
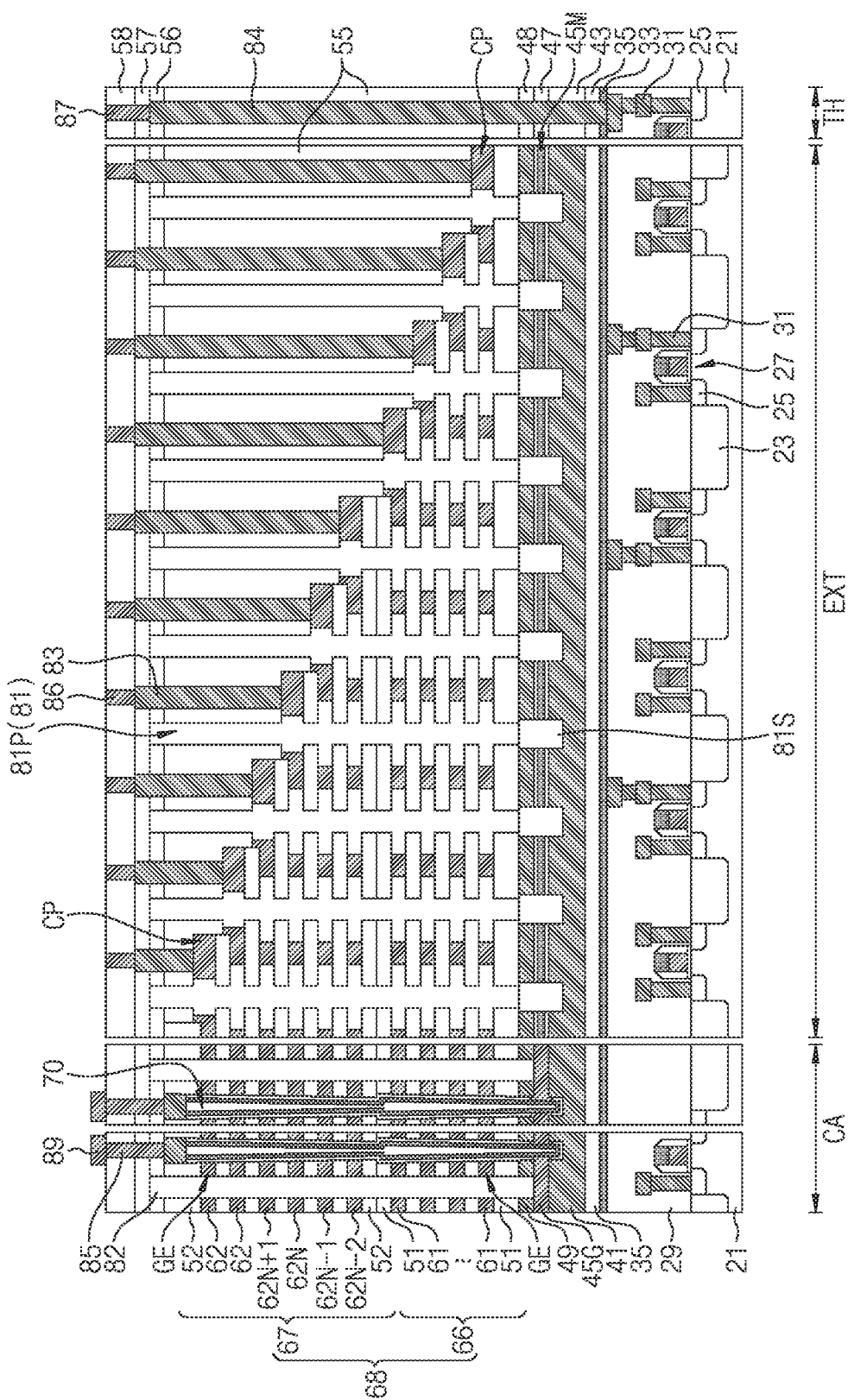
Figure 16:
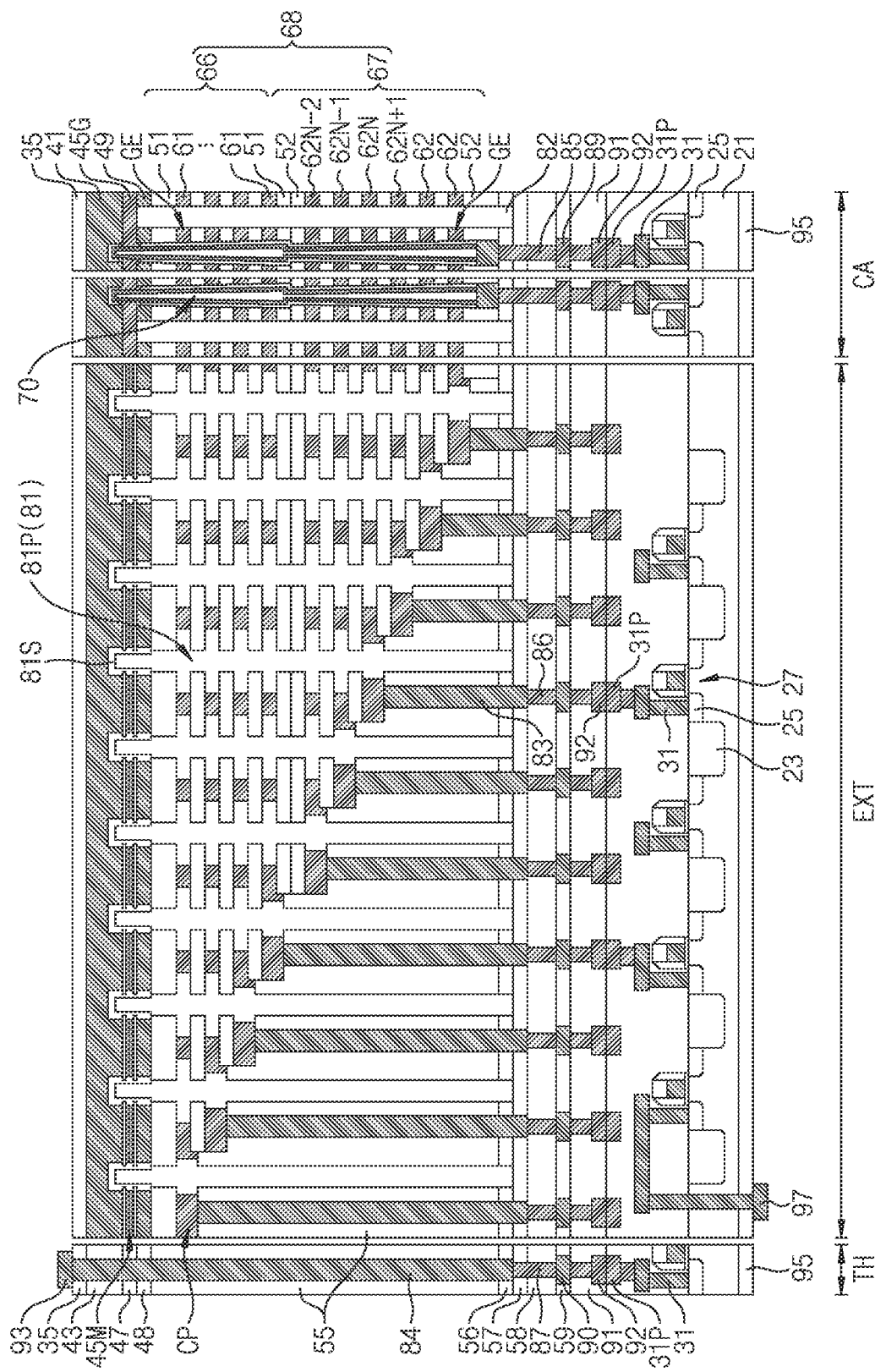

FIGS. 14 to 16 are sectional views explaining semiconductor devices according to exemplary embodiments of the disclosure.

Referring to FIG. 14, the semiconductor devices according to the exemplary embodiments of the disclosure may include a substrate 21, an element isolation layer 23, a plurality of impurity regions 25, a plurality of transistors 27, a first insulating layer 29, a plurality of peripheral circuit wirings 31, a second insulating layer 33, a third insulating layer 35, a source line 41, a fourth insulating layer 43, a connecting electrode layer 45G, a fifth insulating layer 47, a sixth insulating layer 48, a supporter 49, a seventh insulating layer 55, an eighth insulating layer 56, a ninth insulating layer 57, a tenth insulating layer 58, a stack structure 68, a plurality of channel structures 70, a plurality of dummy pillars 81, a plurality of word line isolation patterns 82, a plurality of cell contact plugs 83, a through electrode 84, a plurality of bit plugs 85, a plurality of first intermediate plugs 86, a second intermediate plug 87, and a plurality of bit lines 89.

In an extension area EXT, the supporter 49 may be formed at a lower level than in a cell area CA. In the extension area EXT, a lower surface of the supporter 49 may contact an upper surface of the source line 41. In the extension area EXT, the sixth insulating layer 48 may extend on the supporter 49.

The plurality of dummy pillars 81 may extend into the source line 41 while extending through the eighth insulating layer 56, the stack structure 68, the sixth insulating layer 48 and the supporter 49. Each of the plurality of dummy pillars 81 may include an inactive pillar 81P, and a stud 81S formed in the supporter 49 and the source line 41.

Referring to FIG. 15, the semiconductor devices according to the exemplary embodiments of the disclosure may include a substrate 21, an element isolation layer 23, a plurality of impurity regions 25, a plurality of transistors 27, a first insulating layer 29, a plurality of peripheral circuit wirings 31, a second insulating layer 33, a third insulating layer 35, a source line 41, a fourth insulating layer 43, a connecting electrode layer 45G, a fifth insulating layer 47, a sixth insulating layer 48, a supporter 49, a seventh insulating layer 55, an eighth insulating layer 56, a ninth insulating layer 57, a tenth insulating layer 58, a stack structure 68, a plurality of channel structures 70, a plurality of dummy pillars 81, a plurality of word line isolation patterns 82, a plurality of cell contact plugs 83, a through electrode 84, a plurality of bit plugs 85, a plurality of first intermediate plugs 86, a second intermediate plug 87, and a plurality of bit lines 89.

The plurality of dummy pillars 81 may be formed to extend into the source line 41 while extending through the stack structure 68, the supporter 49 and the connecting mold layer 45M. Each of the plurality of dummy pillars 81 may include an inactive pillar 81P extending through the stack structure 68 while having a greater vertical height than a horizontal width, and a stud 81S formed in the supporter 49, the connecting mold layer 45M and the source line 41. Upper surfaces of the stud 81S, the supporter 49 and the sixth insulating layer 48 may be substantially coplanar as each other. The inactive pillar 81P may be formed on the stud 81S. A lower surface of the inactive pillar 81P may contact the upper surface of the stud 81S.

Referring to FIG. 16, the semiconductor devices according to the exemplary embodiments of the disclosure may include a substrate 21, an element isolation layer 23, a plurality of impurity regions 25, a plurality of transistors 27, a first insulating layer 29, a plurality of peripheral circuit wirings 31, a plurality of first bonding structures 31P, a third insulating layer 35, a source line 41, a fourth insulating layer 43, a connecting electrode layer 45G, a connecting mold layer 45M, a fifth insulating layer 47, a sixth insulating layer 48, a supporter 49, a seventh insulating layer 55, an eighth insulating layer 56, a ninth insulating layer 57, a tenth insulating layer 58, an eleventh insulating layer 59, a stack structure 68, a plurality of channel structures 70, a plurality of dummy pillars 81, a plurality of word line isolation patterns 82, a plurality of cell contact plugs 83, a through electrode 84, a plurality of bit plugs 85, a plurality of first intermediate plugs 86, a second intermediate plug 87, a plurality of bit lines 89, a plurality of intermediate pads 90, a twelfth insulating layer 91, a plurality of bonding structures 92, a first outer pad 93, a thirteenth insulating layer 95, and a second outer pad 97.

The plurality of first bonding structures 31P may be formed in the first insulating layer 29. Each of the plurality of first bonding structures 31P may be connected to a corresponding one of the plurality of peripheral circuit wirings 31. Upper surfaces of the plurality of first bonding structures 31P and the first insulating layer 29 may be substantially coplanar as each other. The plurality of second bonding structures 92 may be formed in the twelfth insulating layer 91.

The twelfth insulating layer 91 and the plurality of second bonding structures 92 may be bonded to upper surfaces of the first insulating layer 29 and the plurality of first bonding structures 31P. The plurality of second bonding structures 92 may be bonded to the plurality of first bonding structures 31P in a wafer bonding manner. Each of the plurality of first bonding structures 31P and the plurality of second bonding structures 92 may include or may be formed of, for example, copper (Cu). Each of the first insulating layer 29 and the twelfth insulating layer 91 may include or may be formed of, for example, silicon oxide.

The eleventh insulating layer 59, the plurality of bit lines 89 and the plurality of intermediate pads 90 may be disposed on the twelfth insulating layer 91 and the plurality of second bonding structures 92. Each of the plurality of bit lines 89 may be connected to a corresponding one of the plurality of second bonding structures 92. Some of the plurality of intermediate pads 90 may be connected to the plurality of second bonding structures 92 and the plurality of first intermediate plugs 86, and some of the plurality of intermediate pads 90 may be connected to the plurality of second bonding structures 92 and the second intermediate plug 87.

The first outer pad 93 may be disposed on the third insulating layer 35. The first outer pad 93 may be connected to the through electrode 84. The thirteenth insulating layer 95 may cover a back surface of the substrate 21. The second outer pad 97 may extend through the thirteenth insulating layer 95 and the substrate 21 such that the second outer pad 97 is connected to the plurality of peripheral circuit wirings 31. A selected one of the first outer pad 93 and the second outer pad 97 may be omitted.

FIGS. 17, 19, 21, 22 and 34, FIGS. 37 to 40, and FIGS. 43 and 46 are sectional views explaining formation methods of semiconductor devices according to exemplary embodiments of the disclosure. FIG. 18 is an enlarged view showing a portion 12 of FIG. 17. FIG. 20 is an enlarged view showing a portion 12 of FIG. 19. FIGS. 23 to 33 are enlarged views showing a portion 12 of FIG. 22. FIGS. 35 and 36 are enlarged views showing a portion 12 of FIG. 34. FIGS. 41 and 42 are enlarged views showing a portion 12 of FIG. 40. FIGS. 44 and 45 are enlarged views showing a portion 12 of FIG. 43.

Figure 17:
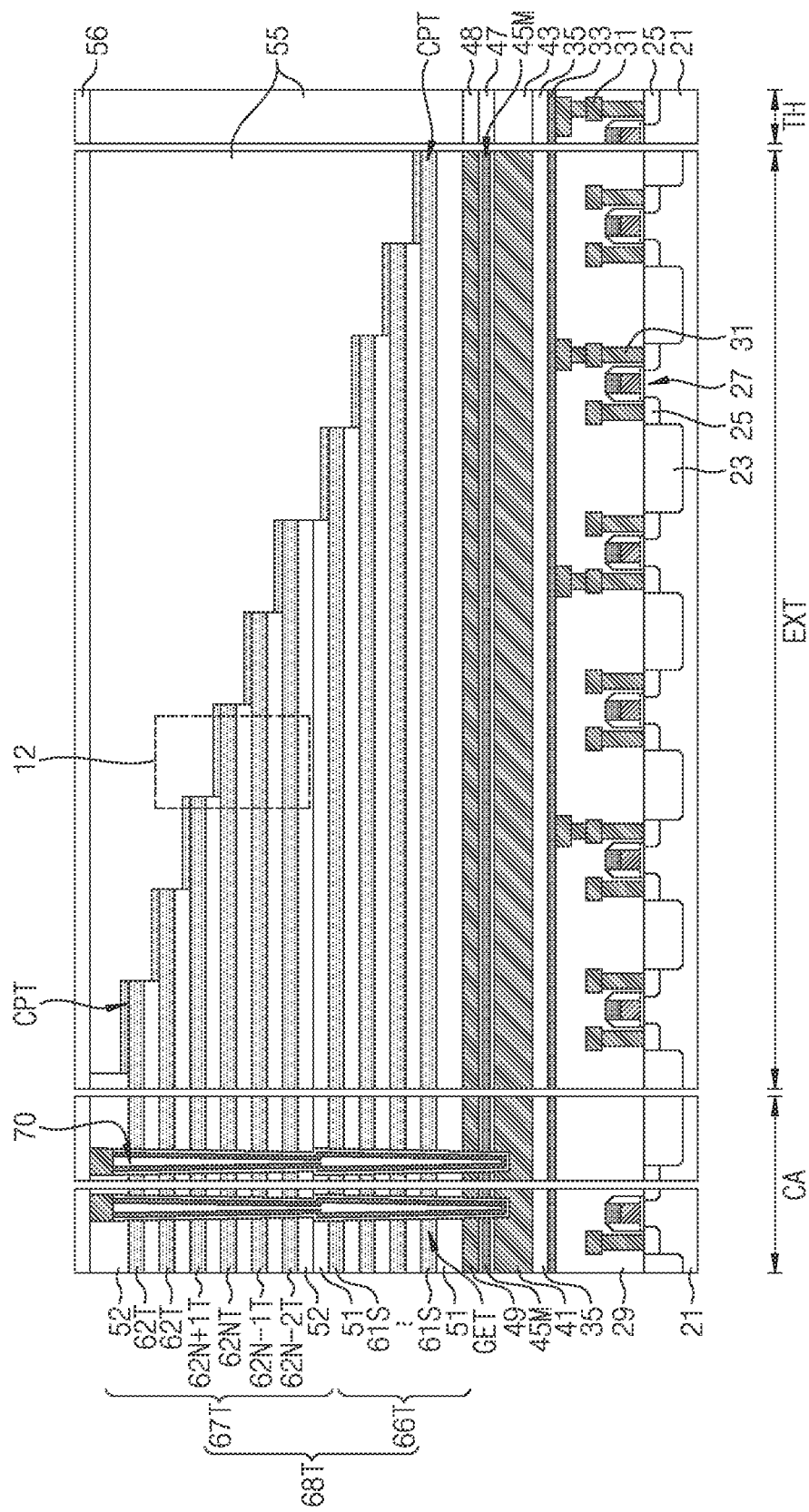
Figure 18:
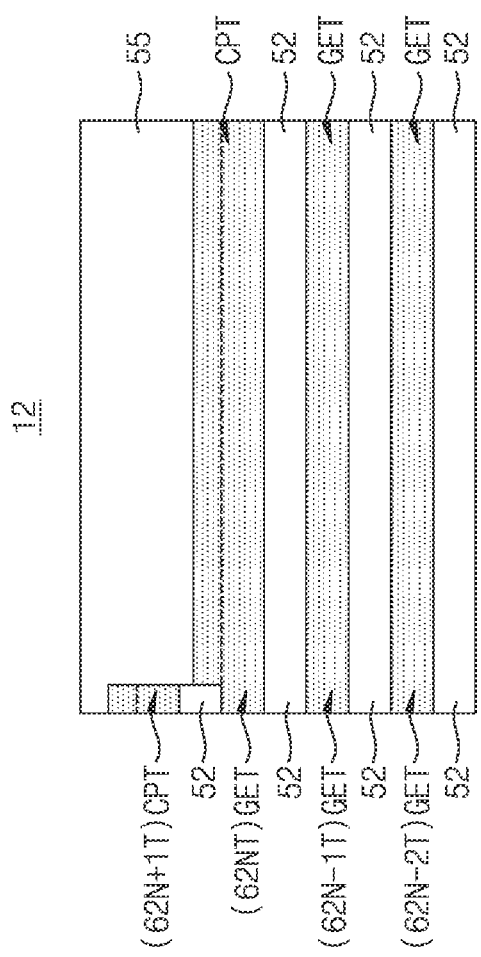

Referring to FIGS. 17 and 18, the semiconductor formation methods according to the exemplary embodiments of the disclosure may include forming an element isolation layer 23, a plurality of impurity regions 25, a plurality of transistors 27, a first insulating layer 29, and a plurality of peripheral circuit wirings 31 on a substrate 21. A second insulating layer 33 may be formed on the first insulating layer 29 and the plurality of peripheral circuit wirings 31. A third insulating layer 35 may be formed on the second insulating layer 33. A source line 41 and a fourth insulating layer 43 may be formed on the third insulating layer 35. A connecting mold layer 45M and a fifth insulating layer 47 may be formed on the source line 41 and the fourth insulating layer 43. A supporter 49 and a sixth insulating layer 48 may be formed on the connecting mold layer 45M and the fifth insulating layer 47.

A preliminary stack structure 68T and a seventh insulating layer 55 may be formed on the supporter 49 and the sixth insulating layer 48. The preliminary stack structure 68T may include a plurality of mold layers 51 and 52 and a plurality of sacrificial layers 61S, 62N−2T, 62N−1T, 62NT, 62N+1T and 62T, which are alternately stacked on the substrate 21. The plurality of mold layers 51 and 52 may include a plurality of first mold layers 51 and a plurality of second mold layers 52. The plurality of sacrificial layers 61S, 62N−2T, 62N−1T, 62NT, 62N+1T and 62T may include a plurality of first sacrificial layers 61S and a plurality of second sacrificial layers 62N−2T, 62N−1T, 62NT, 62N+1T and 62T. Each of the plurality of sacrificial layers 61S, 62N−2T, 62N−1T, 62NT, 62N+1T and 62T may include a sacrificial electrode GET and a sacrificial pad CPT. The plurality of first mold layers 51 and the plurality of first sacrificial layers 61S may constitute a first preliminary stack structure 66T. The plurality of second mold layers 52 and the plurality of second sacrificial layers 62N−2T, 62N−1T, 62NT, 62N+1T and 62T may constitute a second preliminary stack structure 67T.

A plurality of channel structures 70, which extend into the source line 41 while extending through the preliminary stack structure 68T, the supporter 49 and the connecting mold layer 45M, may be formed. An eighth insulating layer 56 may be formed on the preliminary stack structure 68T, the plurality of channel structures 70 and the seventh insulating layer 55.

The plurality of sacrificial layers 61S, 62N−2T, 62N−1T, 62NT, 62N+1T and 62T may include a material having etch selectivity with respect to the plurality of mold layers 51 and 52. The plurality of mold layers 51 and 52 may include or may be formed of silicon oxide, and the plurality of sacrificial layers 61S, 62N−2T, 62N−1T, 62NT, 62N+1T and 62T may include or may be formed of silicon nitride.

Figure 19:
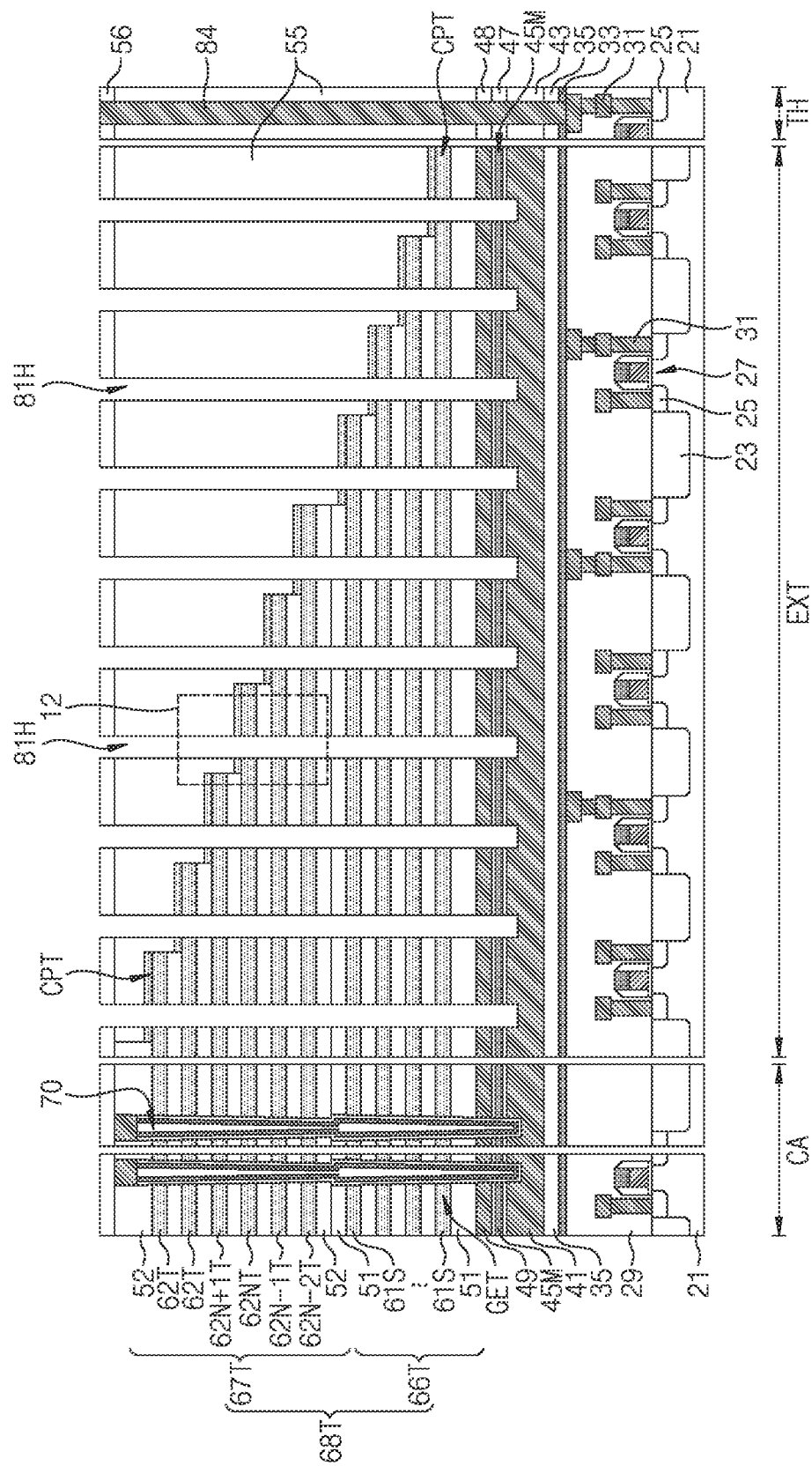
Figure 20:
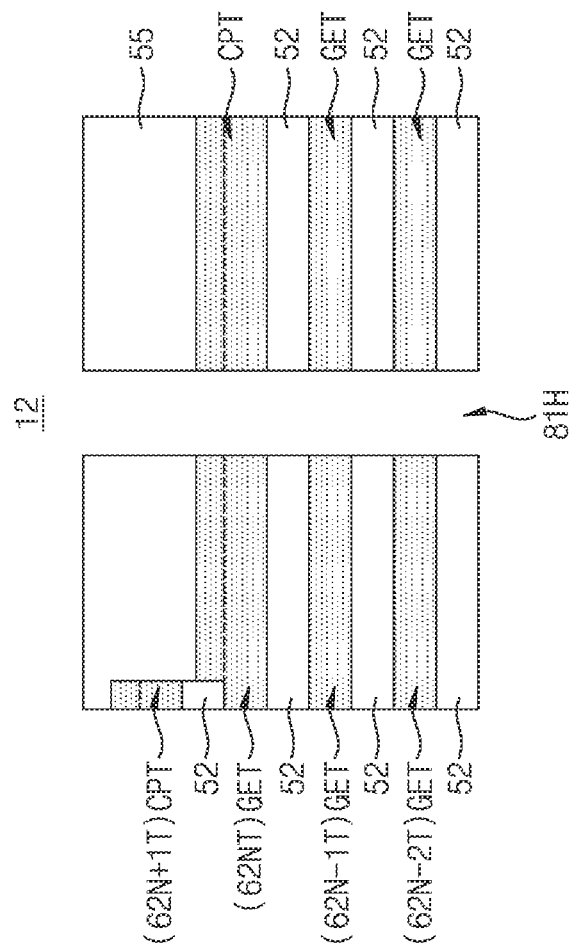

Referring to FIGS. 19 and 20, a through electrode 84, which contacts a corresponding one of the plurality of peripheral circuit wirings 31 while extending through the eighth insulating layer 56, the seventh insulating layer 55, the sixth insulating layer 48, the fifth insulating layer 47, the fourth insulating layer 43, the third insulating layer 35 and the second insulating layer 33, may be formed. A plurality dummy channel holes 81H, which extend into the source line 41 while extending through the eighth insulating layer 56, the seventh insulating layer 55, the preliminary stack structure 68T, the supporter 49 and the connecting mold layer 45M, may be formed.

Figure 21:
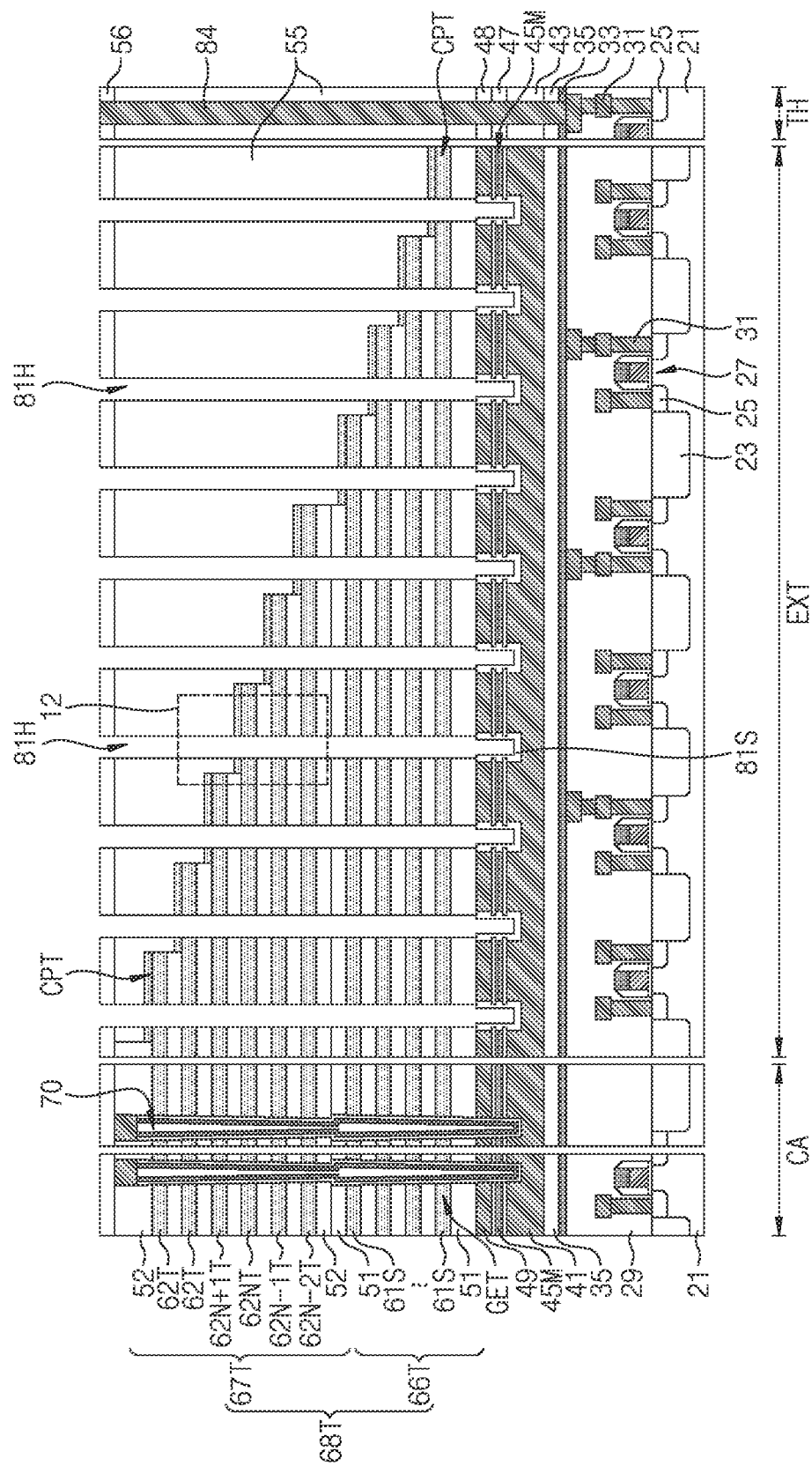

Referring to FIG. 21, a stud 81S may be formed in lower regions of the plurality of dummy channel holes 81H. Formation of the stud 81S may include a thermal oxidation process or a chemical vapor deposition process.

Figure 22:
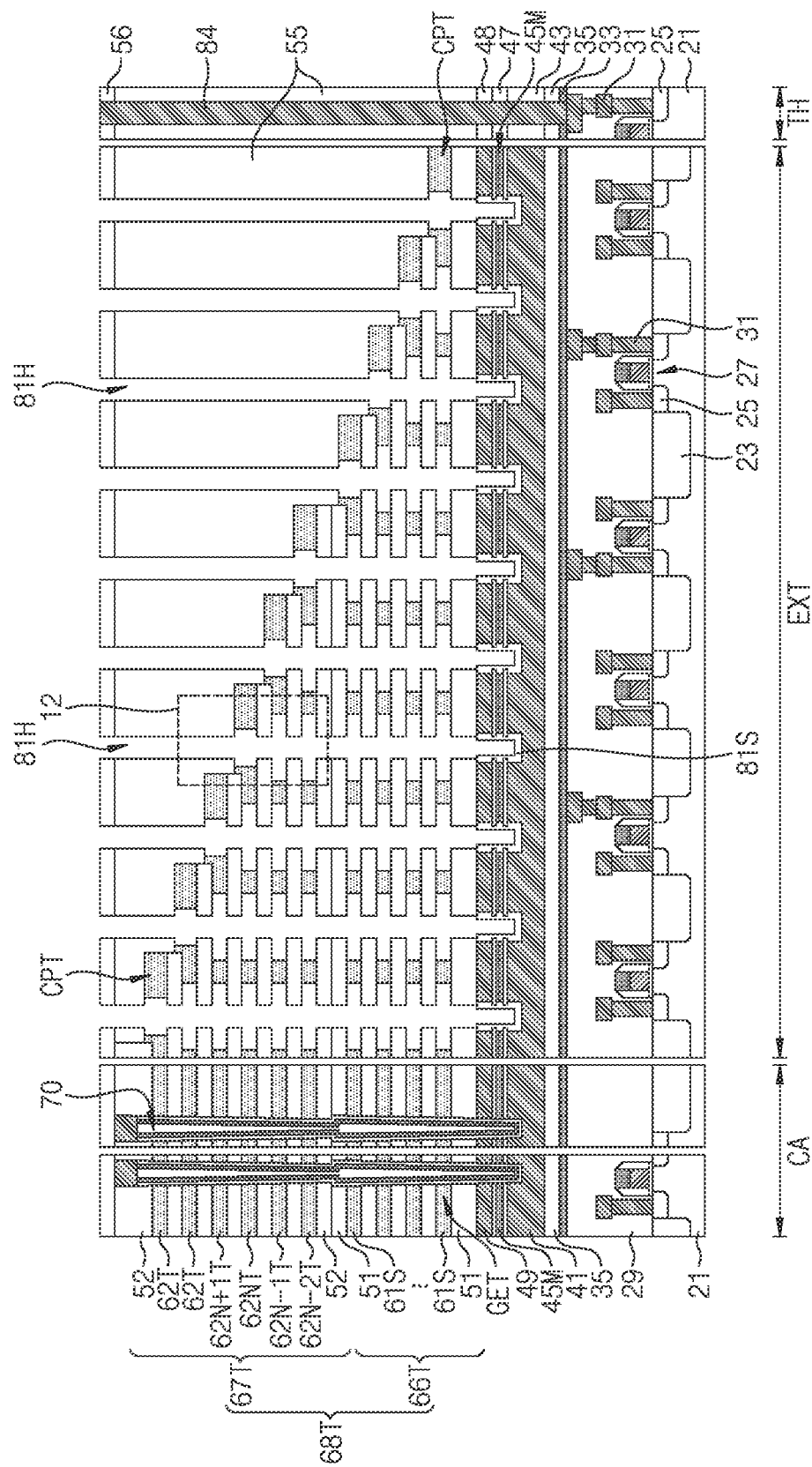
Figure 23:
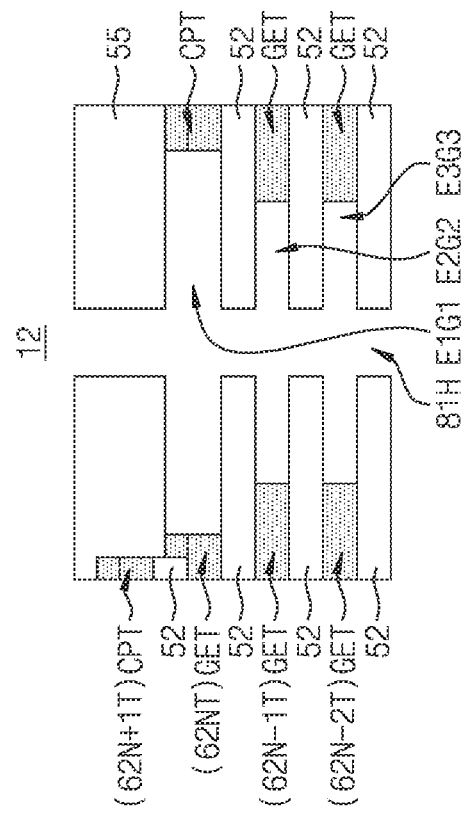

Referring to FIGS. 22 and 23, a plurality of undercut regions E1G1, E2G2, and E3G3 may be formed by expanding insides of the plurality of dummy channel holes 81H. Formation of the plurality of undercut regions E1G1, E2G2, and E3G3 may include an isotropic etching process. The plurality of undercut regions E1G1, E2G2, and E3G3 may include a first undercut region E1G1, a second undercut region E2G2, and a third undercut region E3G3. Sidewalls of the plurality of undercut regions E1G1, E2G2, and E3G3 may have a round shape (e.g., a convex sidewall).

Figure 24:
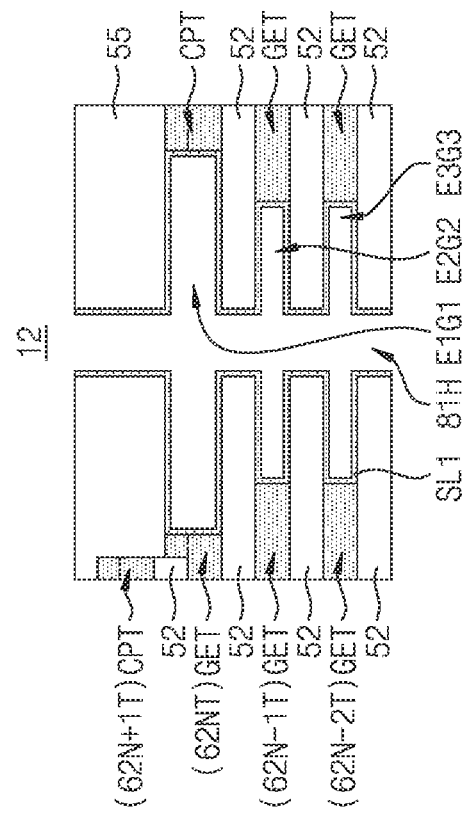

Referring to FIG. 24, the sidewalls of the plurality of undercut regions E1G1, E2G2, and E3G3 may have various shapes.

Figure 25:
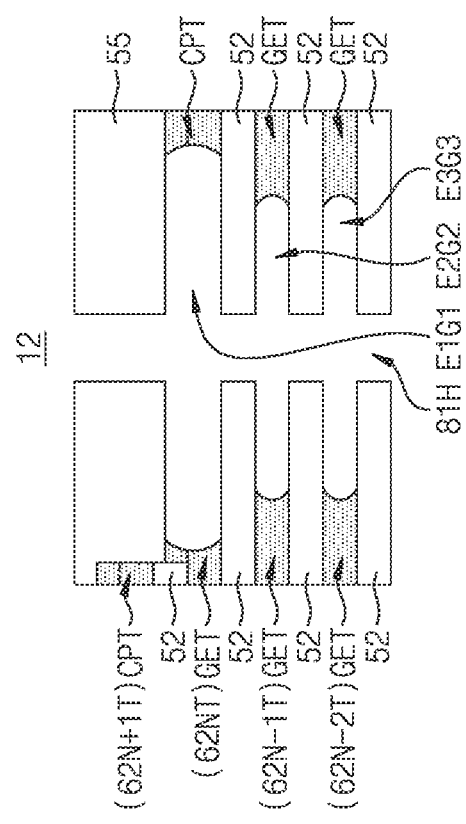

Referring to FIG. 25, a first sacrificial liner SL1 may be formed on inner walls of the plurality of dummy channel holes 81H and the plurality of undercut regions E1G1, E2G2, and E3G3. For example, the first sacrificial liner SL1 may include or may be formed of silicon nitride or silicon oxynitride.

Figure 26:
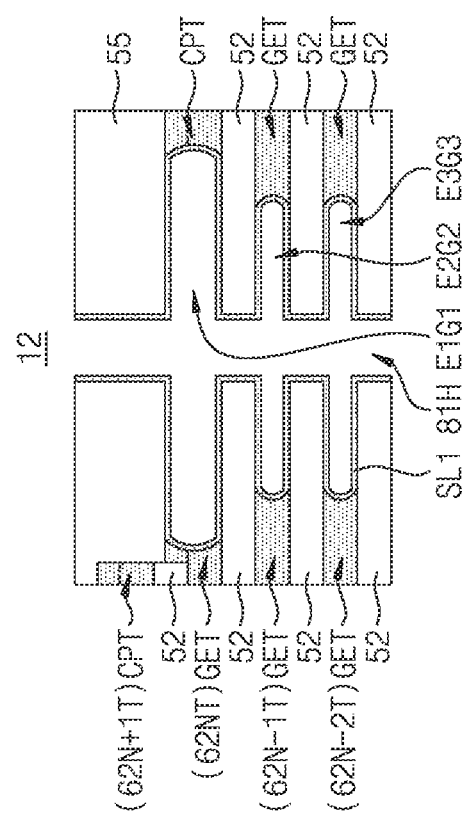

Referring to FIG. 26, the first sacrificial liner SL1 may conformally cover the inner walls of the plurality of dummy channel holes 81H and the plurality of undercut regions E1G1, E2G2, and E3G3.

Figure 27:
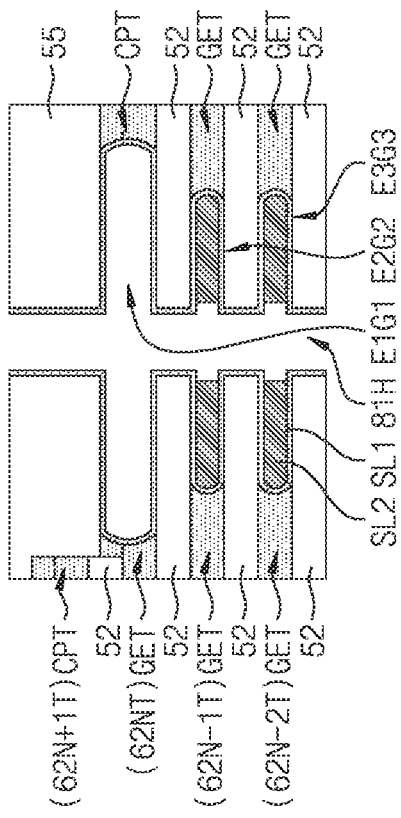

Referring to FIG. 27, a second sacrificial liner SL2 may be formed on the inner walls of the plurality of dummy channel holes 81H and the plurality of undercut regions E1G1, E2G2, and E3G3. The second sacrificial liner SL2 may cover the first sacrificial liner SL1. The second sacrificial liner SL2 may include a material having etch selectivity with respect to the first sacrificial liner SL1. For example, the second sacrificial liner SL2 may include or may be formed of polysilicon. The second sacrificial liner SL2 may conformally cover the inner wall of the first undercut region E1G1. The second sacrificial liner SL2 may completely fill insides of the second undercut region E2G2 and the third undercut region E3G3.

Figure 28:
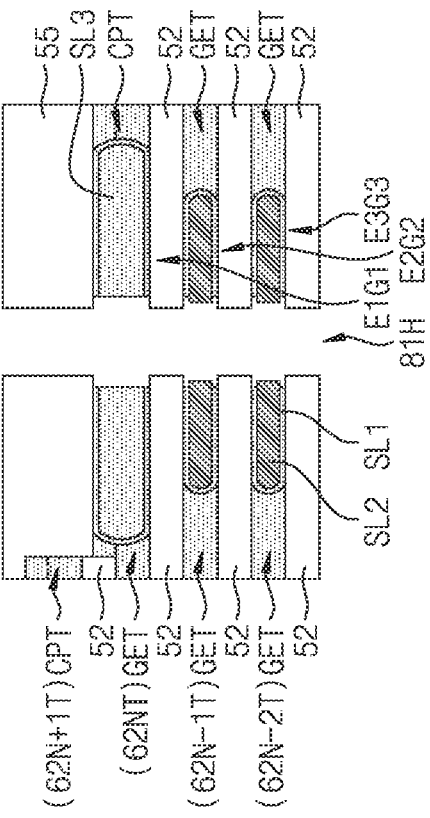

Referring to FIG. 28, the first sacrificial liner SL1 may be exposed by partially removing the second sacrificial liner SL2. The first sacrificial liner SL1 may be exposed on the inner wall of the first undercut region E1G1. The second sacrificial liner SL2 may remain in the insides of the second undercut region E2G2 and the third undercut region E3G3.

Figure 29:
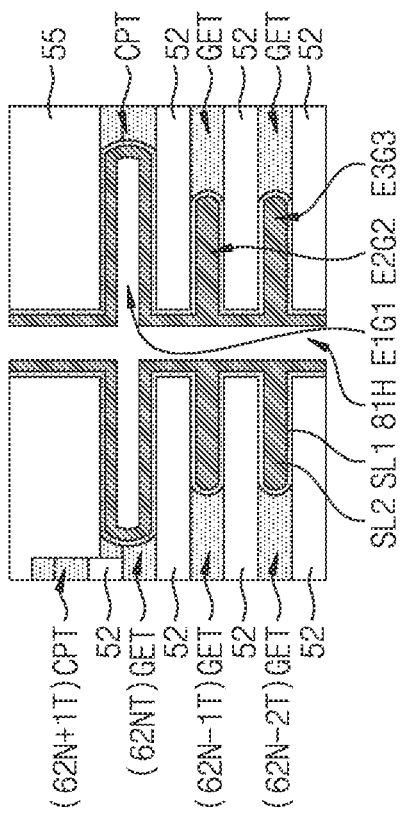

Referring to FIG. 29, a third sacrificial liner SL3 may be formed in the dummy channel hole 81H. The third sacrificial liner SL3 may completely fill the inside of the first undercut region E1G1. The third sacrificial liner SL3 may include substantially the same material as the first sacrificial liner SL1 and/or the plurality of sacrificial layers 61S, 62N−2T, 62N−1T, 62NT, 62N+1T and 62T. For example, the third sacrificial liner SL3 may include or may be formed of silicon nitride or silicon oxynitride.

Figure 30:
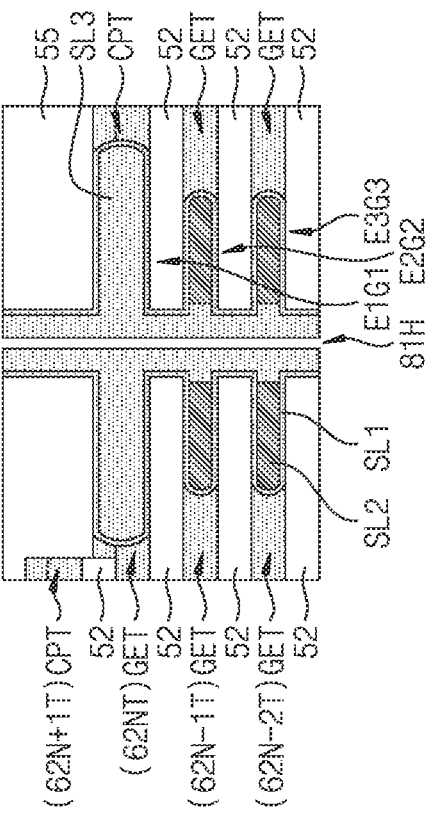

Referring to FIG. 30, inner walls of the dummy channel hole 81H may be exposed by partially removing the third sacrificial liner SL3. The third sacrificial liner SL3 may remain in the inside of the first undercut region E1G1. During partial removal of the third sacrificial liner SL3, the first sacrificial liner SL1 may also be partially removed. The first sacrificial liner SL1 may remain in the insides of the first undercut region E1G1, the second undercut region E2G2, and the third undercut region E3G3.

Referring to FIG. 31, the first sacrificial liner SL1 may be exposed by removing the second sacrificial liner SL2 remaining in the insides of the second undercut region E2G2 and the third undercut region E3G3.

Referring to FIG. 32, the first sacrificial liner SL1 may be partially removed. The first sacrificial liner SL1 and the third sacrificial liner SL3 may locally remain in the inside of the first undercut region ELG1.

Referring to FIG. 33, side surfaces of the first undercut region E1G1, the second undercut region E2G2 and the third undercut region E3G3 may have various profiles.

Figure 34:
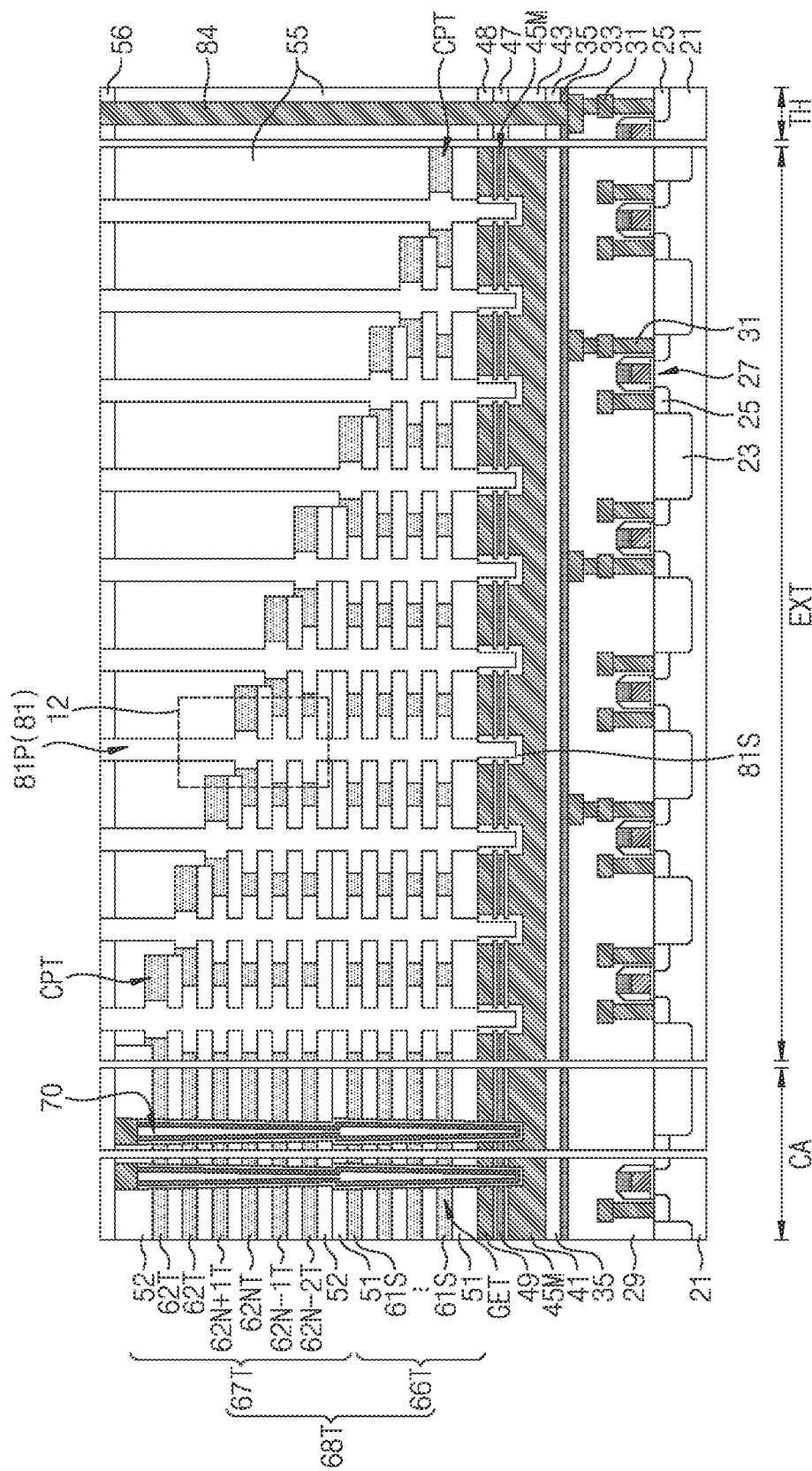
Figure 35:
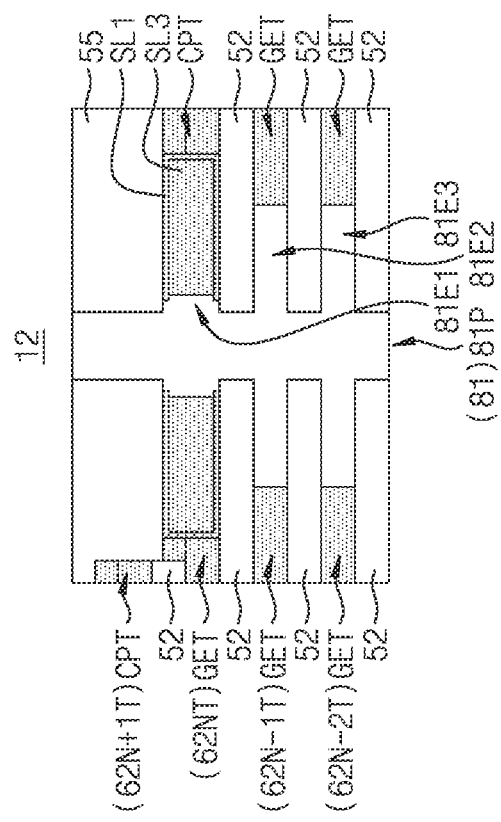
Figure 36:
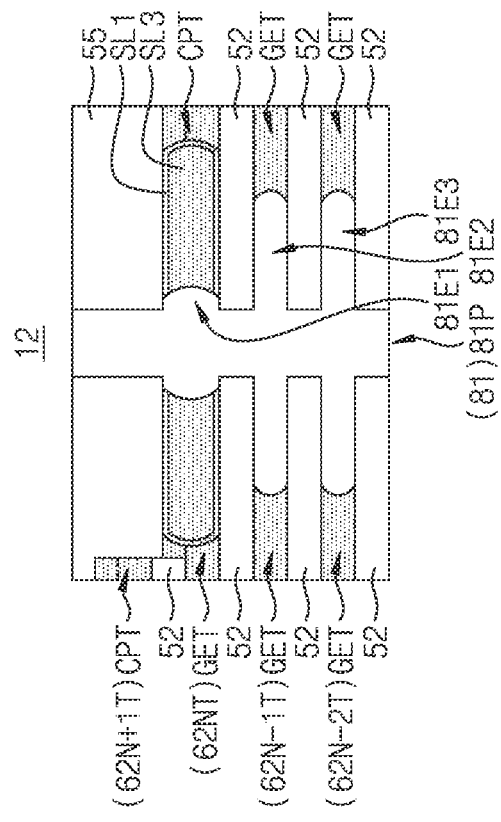

Referring to FIGS. 34 and 35, a plurality of dummy pillars 81 may be formed in the plurality of dummy channel holes 81H. Each of the plurality of dummy pillars 81 may include an inactive pillar 81P, a first extension 81E1, a second extension 81E2, a third extension 81E3, and the stud 81S. The first extension 82E1 may be formed in the first undercut region E1G1, the second extension 81E2 may be formed in the second undercut region E2G2, and the third extension 81E3 may be formed in the third undercut region E3G3.

Referring to FIG. 36, side surfaces of the first extension 81E1, the second extension 81E2, and the third extension 81E3 may have various profiles.

Figure 37:
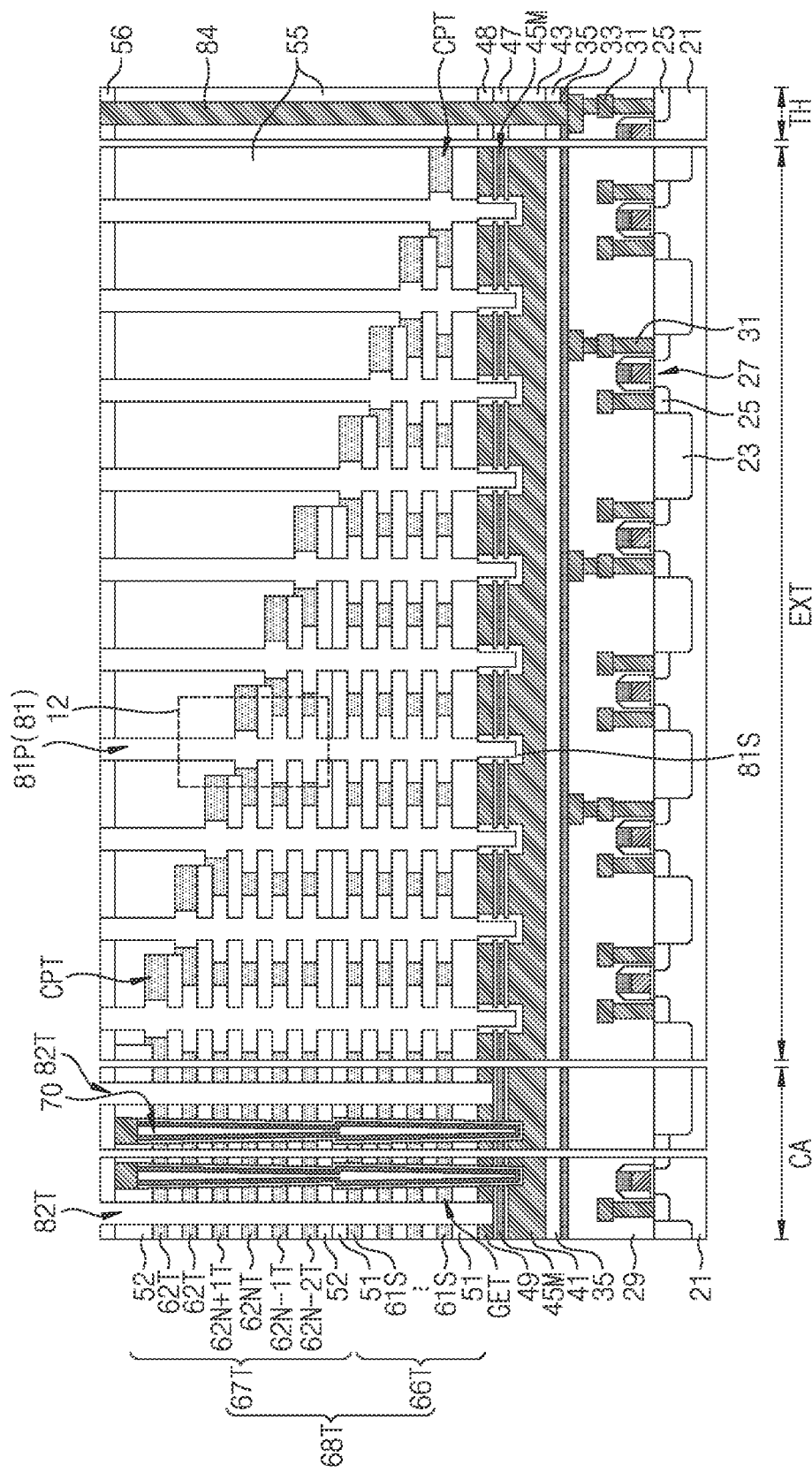

Referring to FIG. 37, a plurality of isolation trenches 82T, which extend through the eighth insulating layer 56, the preliminary stack structure 68T and the supporter 49, may be formed. The connecting mold layer 45M may be exposed at bottoms of the plurality of isolation trenches 82T.

Figure 38:
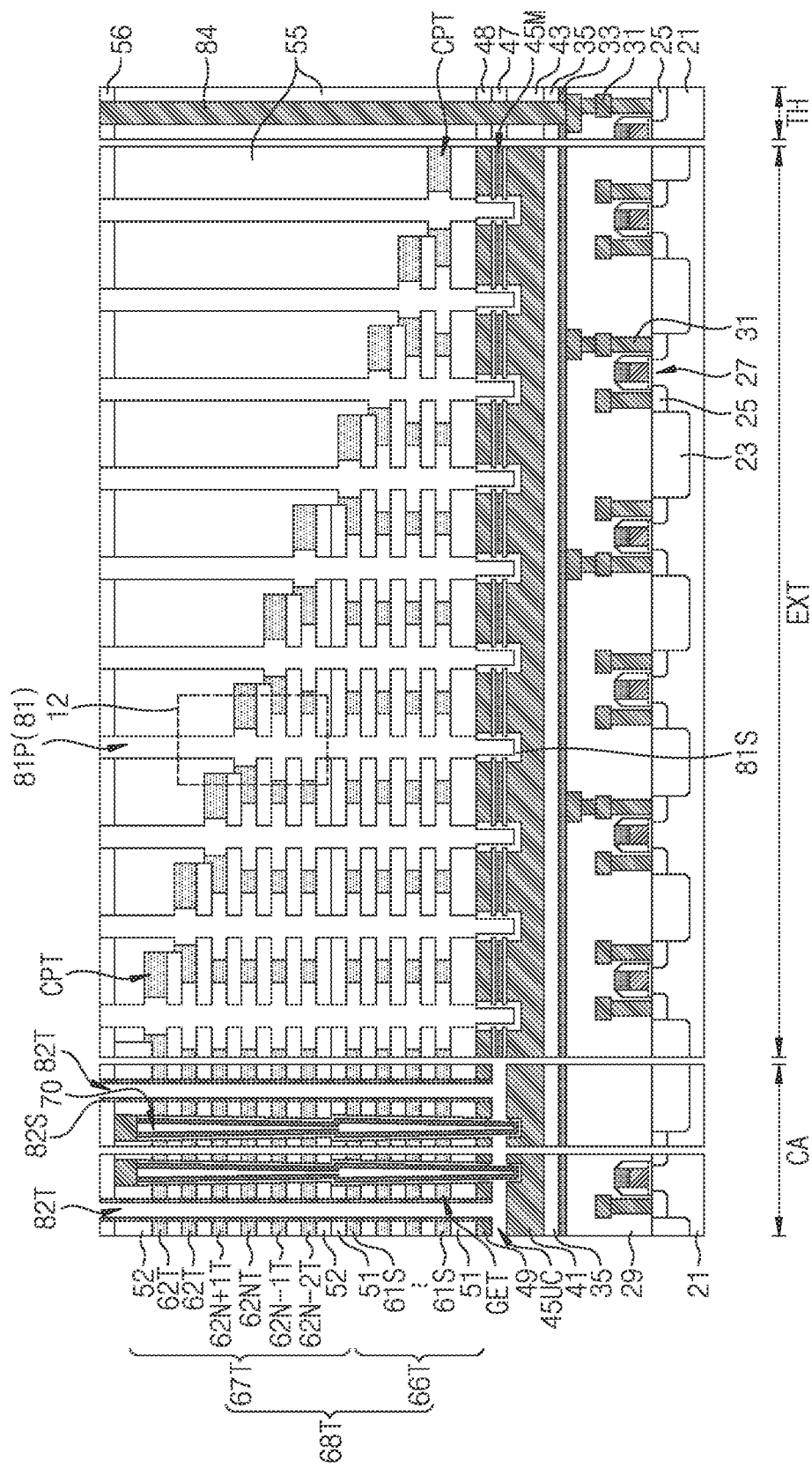

Referring to FIG. 38, a plurality of isolation spacers 82S may be formed at sidewalls of the plurality of isolation trenches 82T. Formation of the plurality of isolation spacers 82S may include a thin film formation process and an anisotropic etching process. For example, the plurality of isolation spacers 82S may include or may be formed of a polysilicon layer. A lower gap region 45UC may be formed by partially removing the connecting mold layer 45M. During formation of the lower gap region 45UC, side surfaces of the information storage pattern ("75" in FIG. 13) may be partially removed. Side surfaces of the channel layer 76 may be exposed in the lower gap region 45UC.

Figure 39:
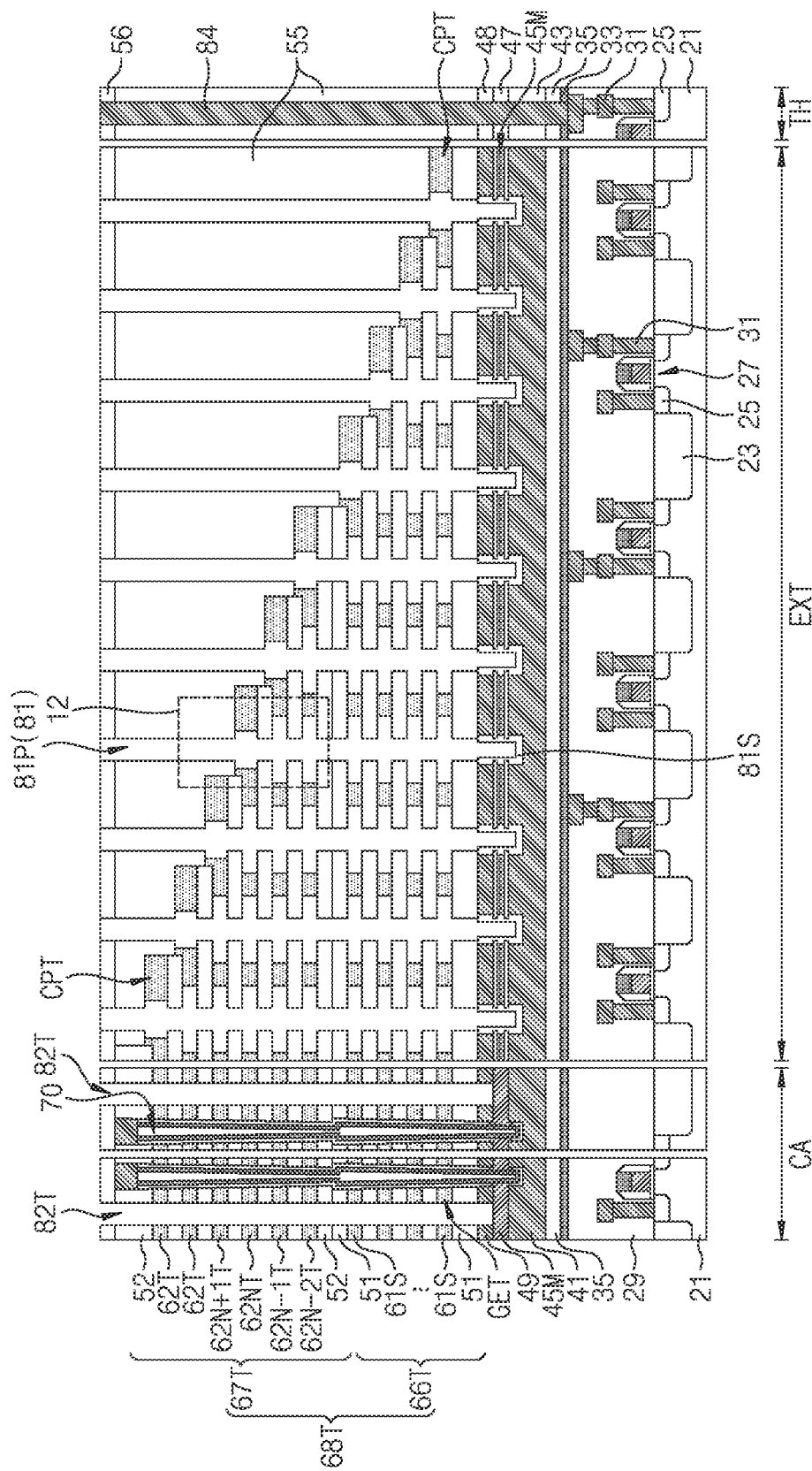

Referring to FIG. 39, a connecting electrode layer 45G may be formed in the lower gap region 45UC. For example, the connecting electrode layer 45G may include or may be formed of a polysilicon layer. Side surfaces of the preliminary stack structure 68T may be exposed in the plurality of isolation trenches 82T through removal of the plurality of isolation spacers 82S.

Figure 40:
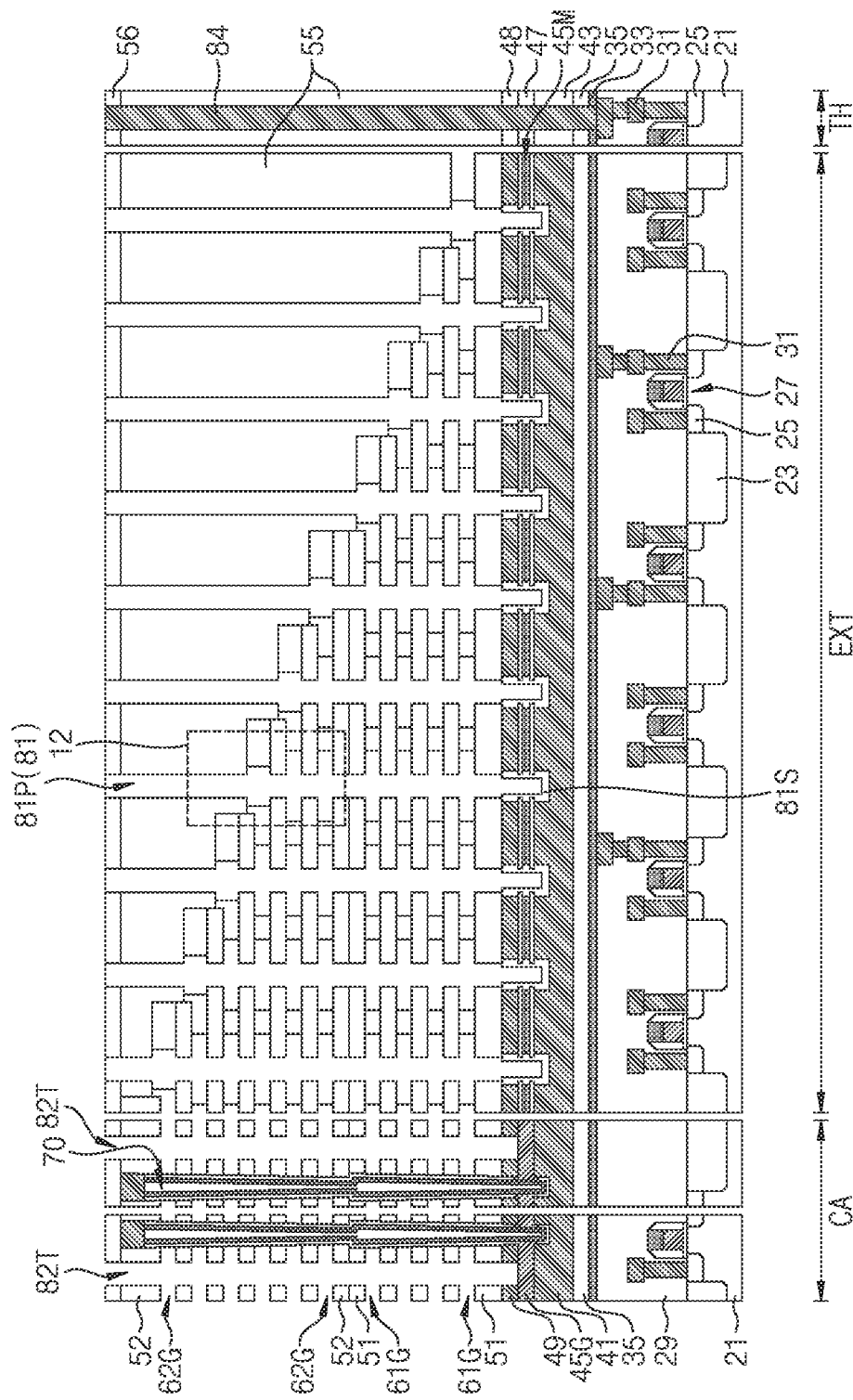
Figure 41:
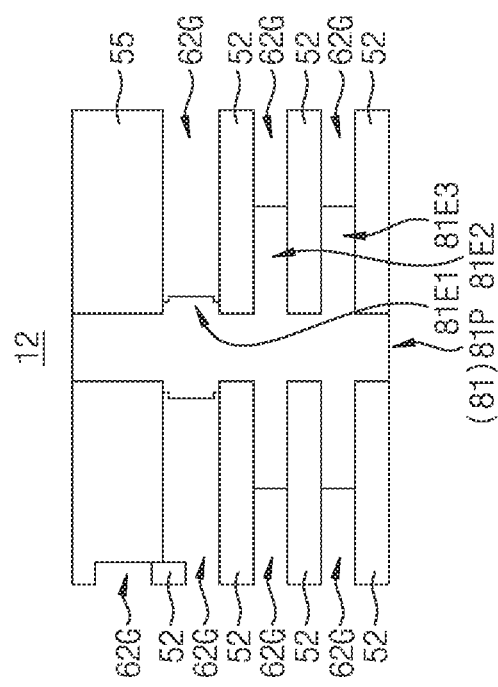

Referring to FIGS. 40 and 41, the plurality of sacrificial layers 61S, 62N−2T, 62N−1T, 62NT, 62N+1T and 62T may be removed, thereby forming a plurality of gap regions 61G and 62G. During formation of the gap regions 61G and 62G, the plurality of dummy pillars 81 may function to prevent deformation of the plurality of mold layers 51 and 52 (for example, collapse). Side surfaces of the plurality of extensions 81E1, 81E2 and 81E3 may be exposed in the plurality of gap regions 61G and 62G. Each of the plurality of extensions 81E1, 81E2 and 81E3 may have a round side surface (e.g., a convex side surface).

Figure 42:
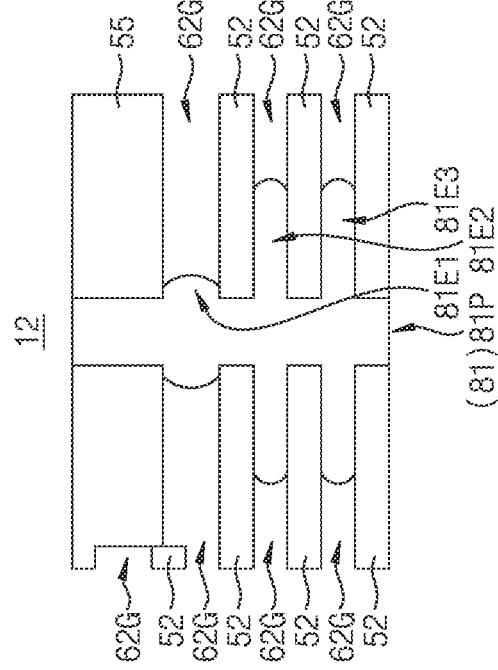

Referring to FIG. 42, the side surfaces of the plurality of extensions 81E1, 81E2 and 81E3 may have various profiles.

Figure 43:
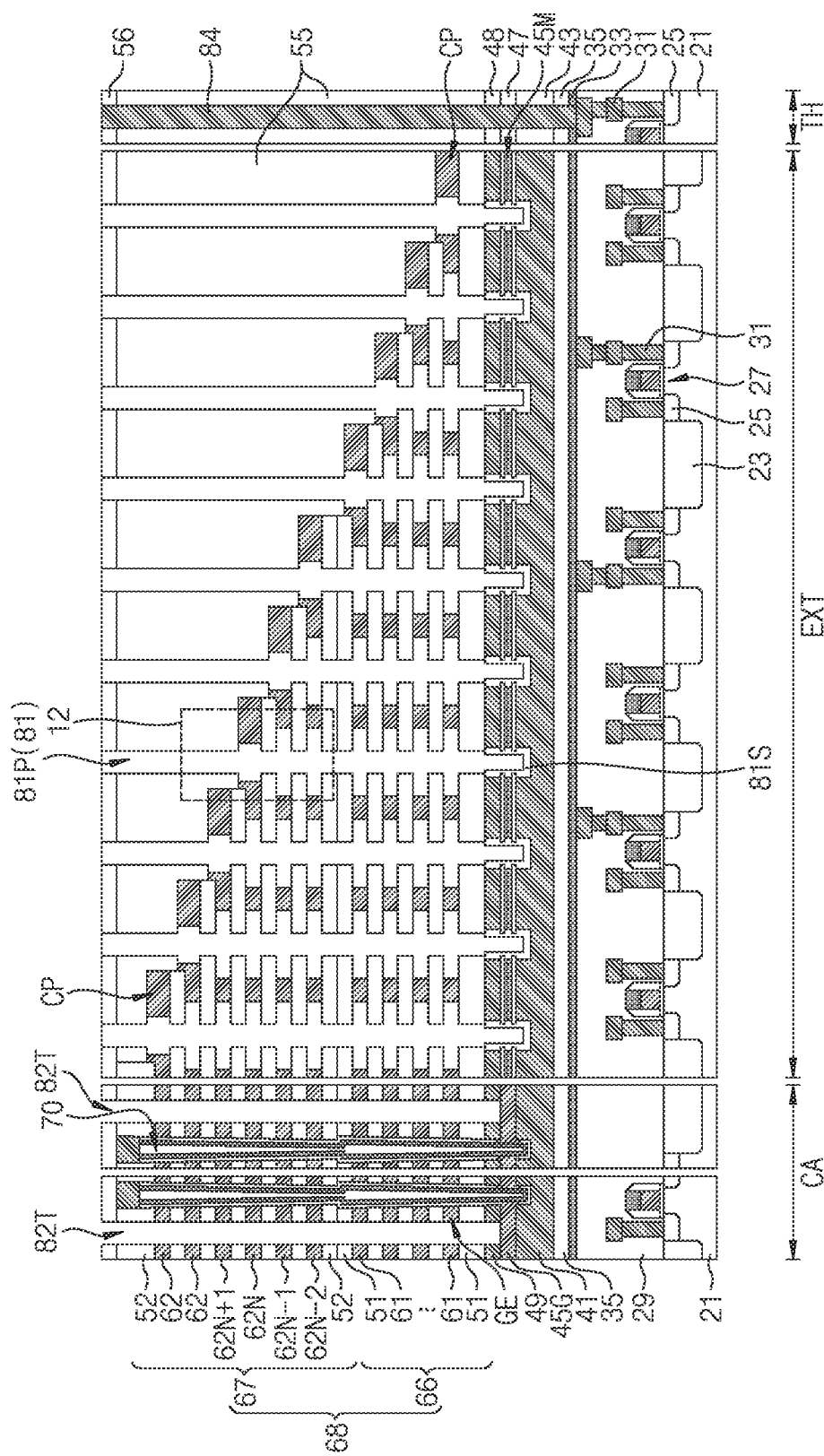
Figure 44:
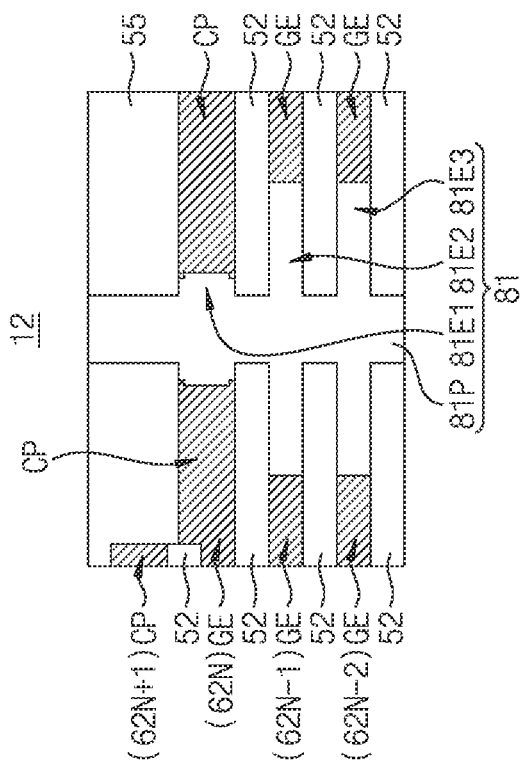
Figure 45:
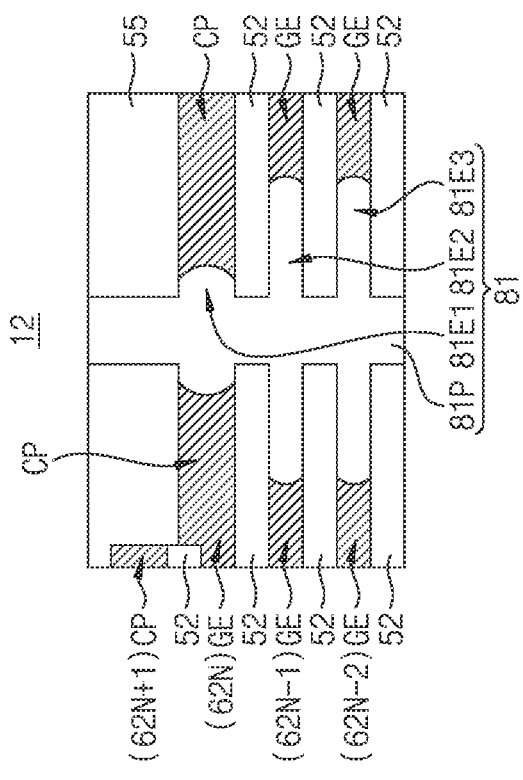

Referring to FIGS. 43 and 44, a plurality of horizontal conductive layers 61, 62N−2, 62N−1, 62N, 62N+1, and 62 may be formed in the plurality of gap regions 61G and 62G. Each of the horizontal conductive layers 61, 62N−2, 62N−1, 62N, 62N+1, and 62 may include a single layer or multiple layers. Each of the horizontal conductive layers 61, 62N−2, 62N−1, 62N, 62N+1, and 62 may include a gate electrode GE and a connecting pad CP. For example, each of the horizontal conductive layers 61, 62N−2, 62N−1, 62N, 62N+1 and 62 may include or may be formed of W, WN, Ti, TiN, Ta, TaN, Co, Ni, Ru, Pt, polysilicon, conductive carbon, or a combination thereof.

Referring to FIG. 45, boundary surfaces of the plurality of extensions 81E1, 81E2, and 81E3, the gate electrode GE and the connecting pad CP may have various profiles.

Figure 46:
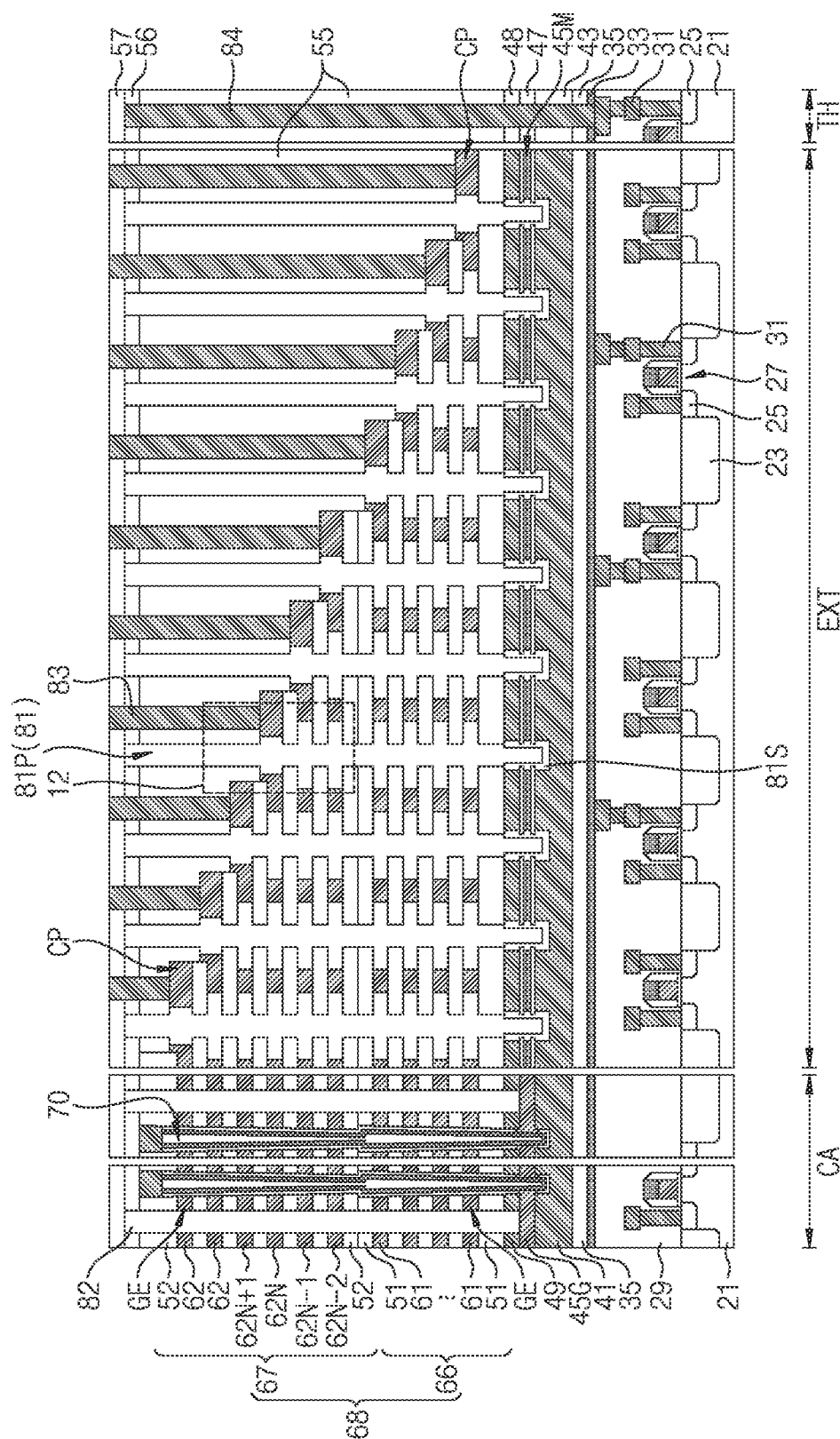

Referring to FIG. 46, a plurality of word line isolation patterns 82 may be formed in the plurality of isolation trenches 82T. A ninth insulating layer 57 may be formed on the eighth insulating layer 56, the plurality of word line isolation patterns 82 and the plurality of dummy pillars 81. A plurality of cell contact plugs 83, which extend through the ninth insulating layer 57, the eighth insulating layer 56 and the seventh insulating layer 55 and contact the connecting pad CP, may be formed. Each of the plurality of cell contact plugs 83 may include a single layer or multiple layers. For example, each of the plurality of cell contact plugs 83 may include or may be formed of W, WN, Ti, TiN, Ta, TaN, Co, Ni, Ru, Pt, polysilicon, conductive carbon, or a combination thereof.

Again referring to FIGS. 1 to 4, a tenth insulating layer 58, a plurality of bit plugs 85, a plurality of first intermediate plugs 86, a second intermediate plug 87 and a plurality of bit lines 89 may be formed.

FIGS. 47 to 50 are sectional views explaining formation methods of semiconductor devices according to exemplary embodiments of the disclosure.

Figure 47:
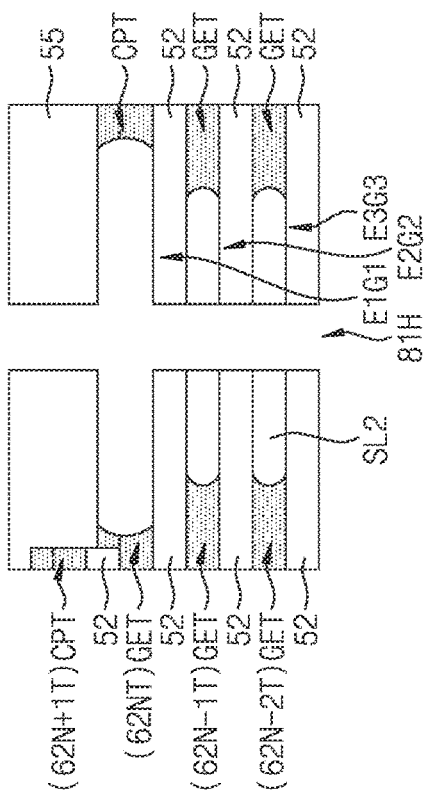

Referring to FIG. 47, a plurality of undercut regions E1G1, E2G2, and E3G3 may be formed by selectively expanding an inside of a dummy channel hole 81H through a method similar to the method described with reference to FIGS. 17 to 23. A second sacrificial liner SL2 may be formed on inner walls of the dummy channel hole 81H and the plurality of undercut regions E1G1, E2G2, and E3G3. For example, the second sacrificial liner SL2 may include or may be formed of silicon oxide or silicon nitride.

Figure 48:
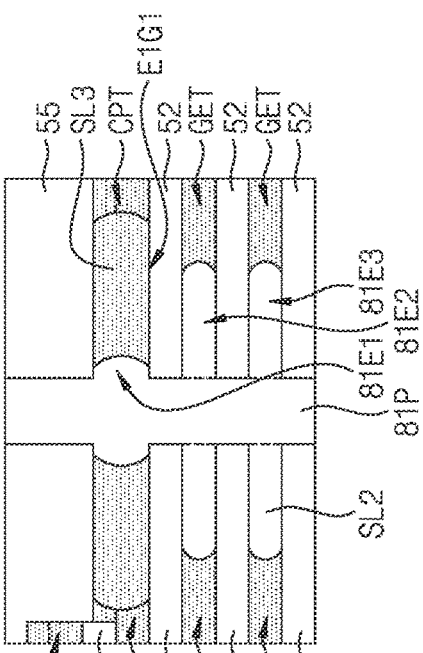

Referring to FIG. 48, the second sacrificial liner SL2 may be partially removed, thereby recovering the first undercut region E1G1. The second sacrificial liner SL2 may remain in the insides of the second undercut region E2G2 and the third undercut region E3G3. For example, the second sacrificial liner SL2 may be partially removed such that the second sacrificial liner SL2 formed in the undercut region E1G1 may be completely removed, and the second sacrificial liner SL2 formed in the insides of the second undercut region E2G2 and the third undercut region E3G3 may remain.

Figure 49:
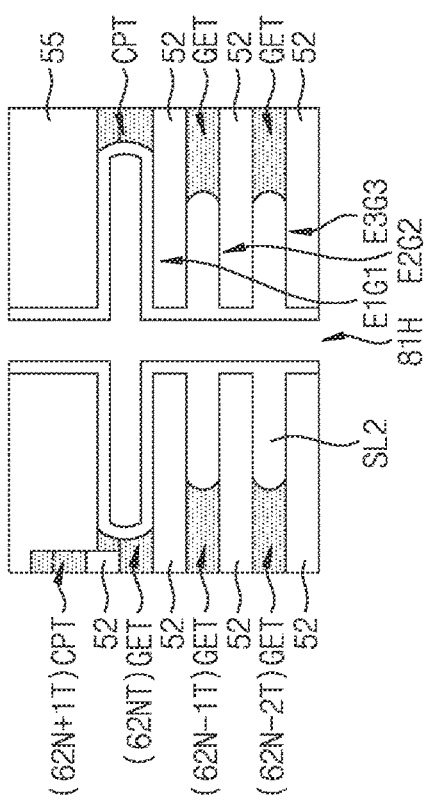

Referring to FIG. 49, a third sacrificial liner SL3 may be formed in the first undercut region E1G1. The first undercut region E1G1 may be reduced by the third sacrificial liner SL3. The reduced first undercut region E1G1 may communicate with the dummy channel hole 81H. For example, the reduced first undercut region E1G1 may be connected to the dummy channel hole 81H.

Figure 50:
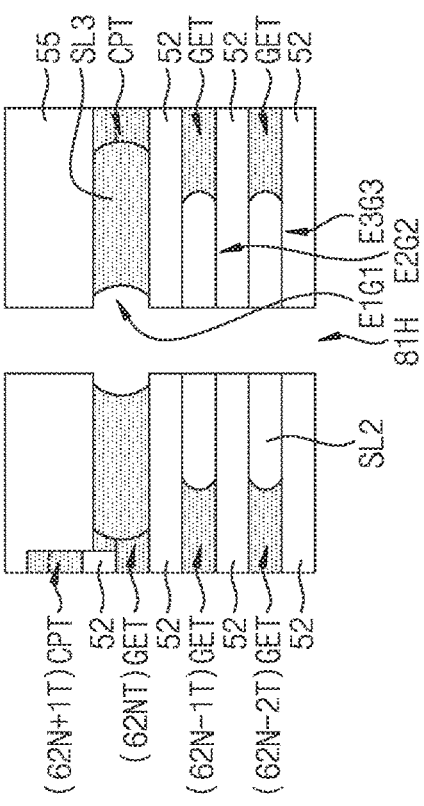

Referring to FIG. 50, a dummy pillar 81 may be formed. The dummy pillar 81 may include an inactive pillar 81P, a first extension 81E1, a second extension 81E2, and a third extension 81E3. The first extension 81E1 may be in continuity with a side surface of the inactive pillar 81P. The first extension 81E1 may include substantially the same material as the inactive pillar 81P. Each of the second extension 81E2 and the third extension 81E3 may contact a side surface of the inactive pillar 81P. Each of the second extension 81E2 and the third extension 81E3 may include the second sacrificial liner SL2. Semiconductor devices may be formed through a method similar to the method described with reference to FIGS. 37 to 46.

FIGS. 51 to 54 are sectional views explaining formation methods of semiconductor devices according to exemplary embodiments of the disclosure.

Referring to FIG. 51, a plurality of undercut regions E1G1, E2G2, and E3G3 may be formed by selectively expanding an inside of a dummy channel hole 81H through a method similar to the method described with reference to FIGS. 17 to 23. A second sacrificial liner SL2 may be formed on inner walls of the dummy channel hole 81H and the plurality of undercut regions E1G1, E2G2, and E3G3. The second sacrificial liner SL2 may include or may be formed of polysilicon. The second sacrificial liner SL2 may fill the second and third undercut regions E2G2, and E3G3, and may conformally cover the inner wall of the first undercut region E1G1 without completely filling the first undercut region E1G1.

Referring to FIG. 52, the second sacrificial liner SL2 may be partially removed, thereby recovering the first undercut region E1G1. The second sacrificial liner SL2 may remain in the insides of the second undercut region E2G2 and the third undercut region E3G3. For example, the second sacrificial liner SL2 may be partially removed such that the second sacrificial liner SL2 formed in the undercut region E1G1 may be completely removed, and the second sacrificial liner SL2 formed in the insides of the second undercut region E2G2 and the third undercut region E3G3 may remain.

Referring to FIG. 53, a third sacrificial liner SL3 may be formed in the first undercut region E1G1. The first undercut region E1G1 may be reduced by the third sacrificial liner SL3. The reduced first undercut region E1G1 may communicate with the dummy channel hole 81H. For example, the reduced first undercut region E1G1 may be connected to the dummy channel hole 81H.

Referring to FIG. 54, the second sacrificial liner SL2 may be removed, thereby recovering the second undercut region E2G2 and the third undercut region E3G3. For example, the second sacrificial liner SL2 formed in the second undercut region E2G2 and the third undercut region E3G3 may be completely removed. Semiconductor devices may be formed through a method similar to the method described with reference to FIGS. 34 to 46.

FIGS. 55 and 56 are sectional views explaining formation methods of semiconductor devices according to exemplary embodiments of the disclosure.

Referring to FIG. 55, etching lag ions may be implanted in a sacrificial pad CPT using an ion implantation process. For example, the etching lag ions may include or may be B, BF, $BF_2$, or a combination thereof.

Referring to FIG. 56, a plurality of undercut regions E1G1, E2G2, and E3G3 may be formed by selectively expanding an inside of a dummy channel hole 81H. Formation of the plurality of undercut regions E1G1, E2G2, and E3G3 may include an isotropic etching process. The etching rate of the sacrificial pad CPT may be lower than the etching rate of a sacrificial electrode GET due to implantation of the etching lag ions. The horizontal width of the first undercut region E1G1 may be smaller than the horizontal width of the second undercut region E2G2 or the third undercut region E3G3. Semiconductor devices may be formed through a method similar to the method described with reference to FIGS. 34 to 46.

FIGS. 57 and 58 are sectional views explaining formation methods of semiconductor devices according to exemplary embodiments of the disclosure.

Referring to FIG. 57, etching lag ions may be implanted in a sacrificial pad CPT using an ion implantation process in accordance with a method similar to the method described with reference to FIG. 55. For example, the etching lag ions may include or may be B, BF, $BF_2$, or a combination thereof. A plurality of extensions 81E1, 81E2 and 81E3 may be formed at sidewalls of a dummy channel hole 81H using an oxidation process. The oxidation rate of the sacrificial pad CPT may be lower than the oxidation rate of a sacrificial electrode GET due to implantation of the etching lag ions. The horizontal width of the first extension 81E1 may be smaller than the horizontal width of the second extension 81E2 or the third extension 81E3. The plurality of extensions 81E1, 81E2 and 81E3 may include silicon oxynitride, silicon oxide, SiBON, SiBO, or a combination thereof.

The first extension 81E1 may include a material different from those of the second extension 81E2 and the third extension 81E3. The first extension 81E1 may include a material layer having a composition different from those of the second extension 81E2 and the third extension 81E3. The first extension 81E1 may include or may be formed of silicon oxynitride, silicon oxide, SiBON, SiBO, or a combination thereof, whereas the second extension 81E2 and the third extension 81E3 may include or may be formed of silicon oxynitride, silicon oxide, or a combination thereof.

Referring to FIG. 58, an inactive pillar 81P may be formed in the dummy channel hole 81H. Semiconductor devices may be formed through a method similar to the method described with reference to FIGS. 37 to 46.

Figure 59:
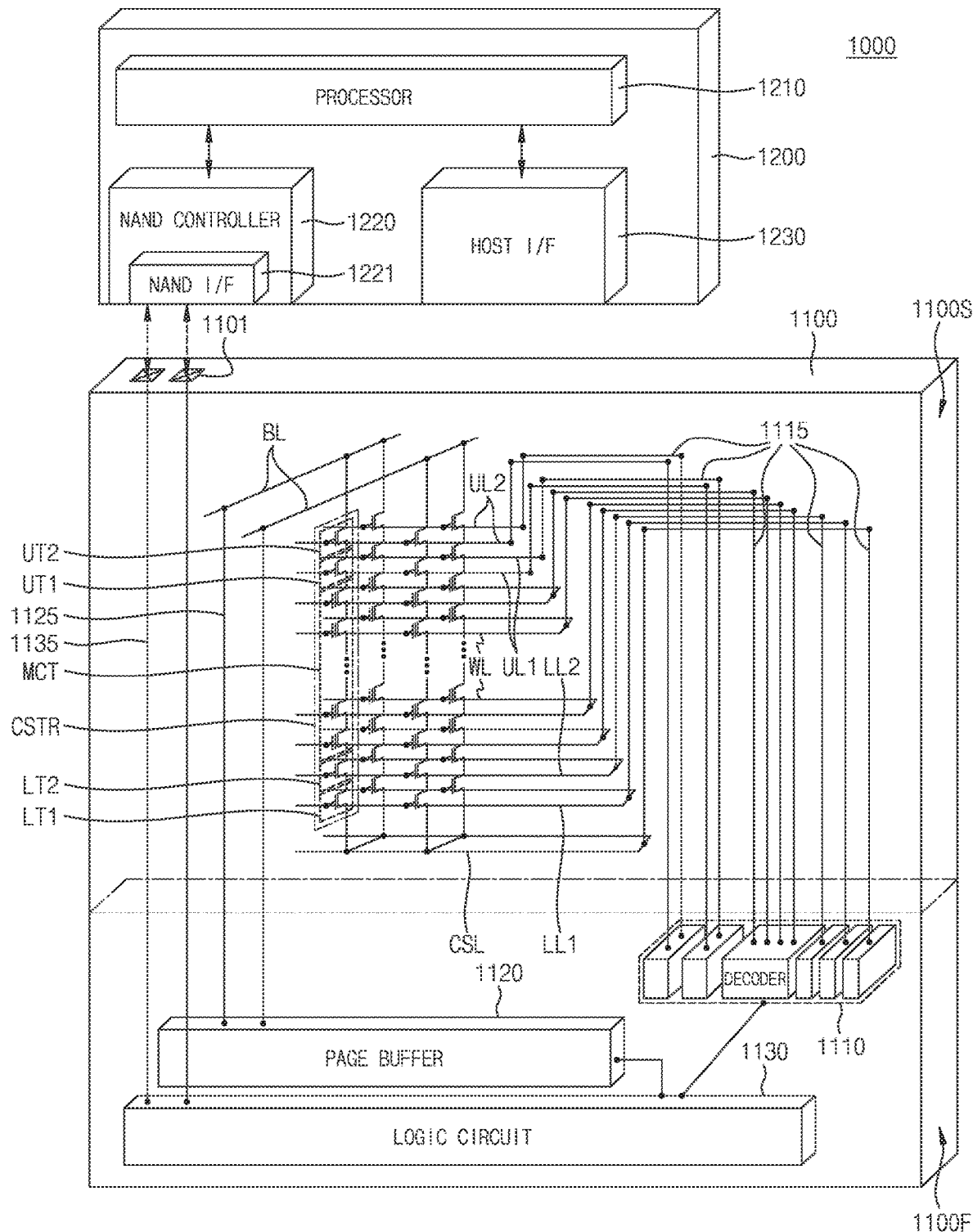
FIG. 59 is a view schematically showing an electronic system including semiconductor devices according to exemplary embodiments of the disclosure.

FIG. 59 is a view schematically showing an electronic system including semiconductor devices according to exemplary embodiments of the disclosure.

Referring to FIG. 59, an electronic system 1000 may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid state drive (SSD) device, a universal serial bus (USB), a computing system, a medical device or a communication device which includes one semiconductor device 1100 or a plurality of semiconductor devices 1100.

The semiconductor device 1100 may be a non-volatile memory device. For example, the semiconductor device 1100 may include a semiconductor device described with reference to FIGS. 1 to 58. The semiconductor device 1100 may include a first structure 1110F, and a second structure 1100S on the first structure 1110F. In exemplary embodiments, the first structure 1110F may be disposed at one side of the second structure 1100S. The first structure 1110F may be a peripheral circuit structure including a decoder circuit 1110, a page buffer 1120 and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be diversely varied in accordance with embodiments.

In exemplary embodiments, the upper transistors UT1 and UT2 may include a string selection transistor, whereas the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, respectively. The first and second gate upper lines UL1 and UL2 may be gate electrodes of the upper transistors UT1 and UT2, respectively.

In exemplary embodiments, the lower transistors LT1 and LT2 may include a lower erase control transistor LT1 and a ground selection transistor LT2 which are connected in series. The upper transistors UT1 and UT2 may include a string selection transistor UT1 and an upper erase control transistor UT2 which are connected in series. At least one of the lower erase control transistor LT1 and the upper erase control transistor UT1 may be used in an erase operation for deleting data stored in the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 via first connecting lines 1115 extending from the first structure 1110F to the second structure 1100S. The bit lines BL may be electrically connected to the page buffer 1120 via second connecting lines 1125 extending from the first structure 1110F to the second structure 1100S.

In the first structure 1110F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The electronic system 1000 may communicate with the controller 1200 through input/output pads 1101 electrically connected to the logic circuit 1130. The input/output pads 1101 may be electrically connected to the logic circuit 1130 via an input/output connecting line 1135 extending from the first structure 1110F to the second structure 1100S.

The controller 1200 may include a processor 1210, a NAND controller 1220, and a host interface 1230. In accordance with embodiments, the electronic system 1000 may include a plurality of semiconductor devices 1100. The controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 60:
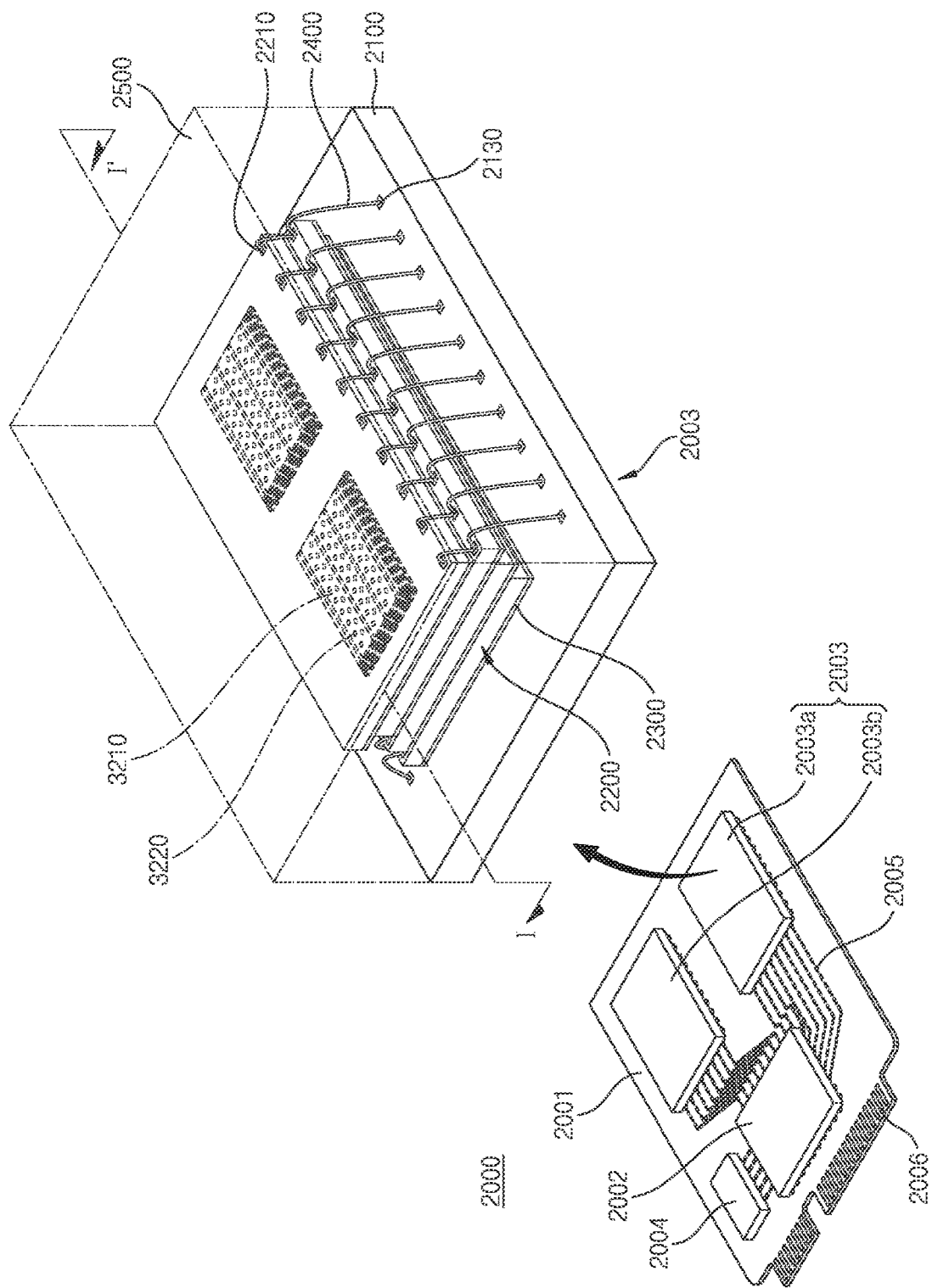
FIG. 60 is a perspective view schematically showing an electronic system including semiconductor devices according to exemplary embodiments of the disclosure.

FIG. 60 is a perspective view schematically showing an electronic system including semiconductor devices according to exemplary embodiments of the disclosure.

Referring to FIG. 60, an electronic system 2000 according to exemplary embodiments of the disclosure may include a main substrate 2001, a controller 2002 mounted on the main substrate 2001, at least one semiconductor package 2003, and a dynamic random access memory (DRAM) 2004. The semiconductor package 2003 and the DRAM 2004 may be connected to the controller 2002 by wiring patterns 2005 formed on the main substrate 2001.

The main substrate 2001 may include a connector 2006 including a plurality of pins to be coupled to an external host. The number and arrangement of the plurality of pins in the connector 2006 may be varied in accordance with a communication interface between the electronic system 2000 and the external host. In exemplary embodiments, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), etc. In exemplary embodiments, the electronic system 2000 may operate by power supplied from the external host. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, bonding layers 2300 respectively disposed at lower surfaces of the semiconductor chips 2200, a connecting structure 2400 for electrically connecting the semiconductor chips 2200 and the package substrate 2100 with each other, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include input/output pads 2210. The input/output pads 2210 may correspond to the input/output pads 1101 of FIG. 59. Each of the semiconductor chips 2200 may include gate stack structures 3210 and memory channel structures 3220. Each of the semiconductor chips 2200 may include a semiconductor device described with reference to FIGS. 1 to 58. For example, the gate stack structures 3210 may include the stack structure ("68" in FIG. 1), and the memory channel structures 3220 may include the plurality of channel structures ("70" in FIG. 1).

In exemplary embodiments, the connecting structure 2400 may be bonding wires for electrically connecting the input/output pads 2210 and the package upper pads 2130 with each other, respectively. Accordingly, in each of the first and second semiconductor packages 2003a and 2003b, the semiconductor chips 2200 may be electrically interconnected through wire bonding to each other, and may be electrically connected to the corresponding package upper pads 2130 of the package substrate 2100. In accordance with embodiments, in each of the first and second semiconductor packages 2003a and 2003b, the semiconductor chips 2200 may be electrically interconnected by a connecting structure including through-silicon vias (TSVs) in place of the bonding wire type connecting structure 2400.

In exemplary embodiments, the controller 2002 and the semiconductor chips 2200 may be included in one package. In an exemplary embodiment, the controller 2002 and the semiconductor chips 2200 may be mounted on a separate interpose substrate different from the main substrate 2001. The controller 2002 and the semiconductor chips 2200 may be interconnected by wirings formed at the interposer substrate.

Figure 61:
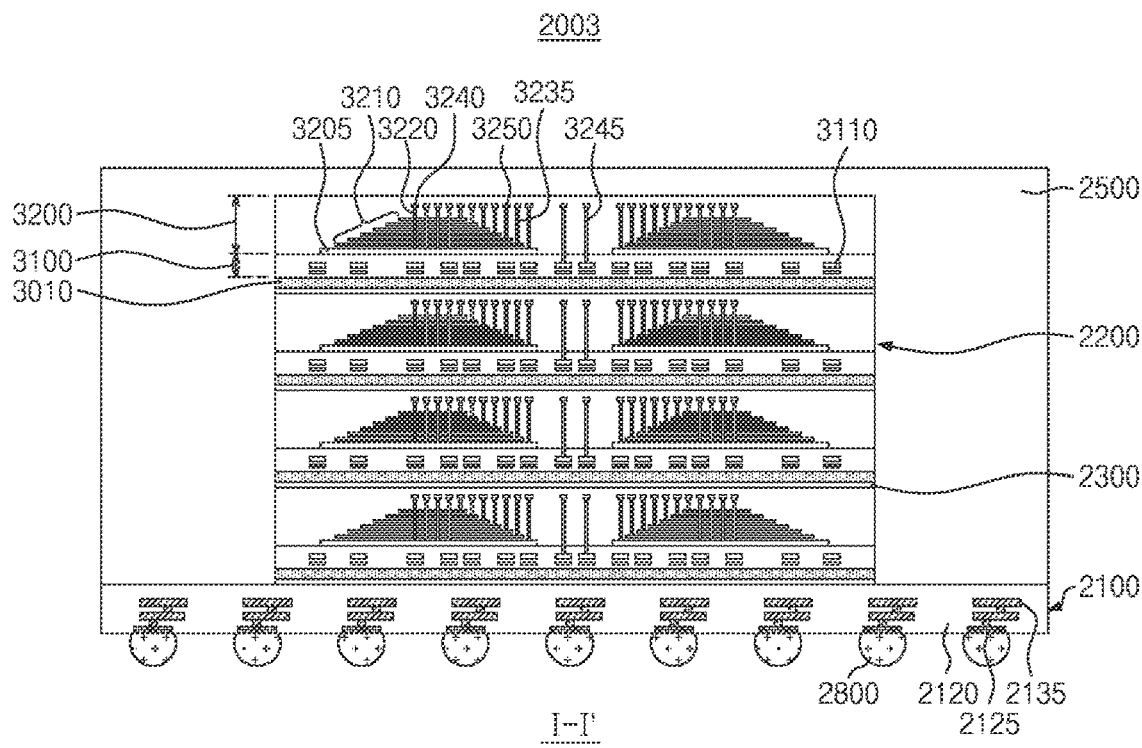
FIGS. 61 and 62 are sectional views schematically showing semiconductor packages according to exemplary embodiments of the disclosure.
Figure 62:
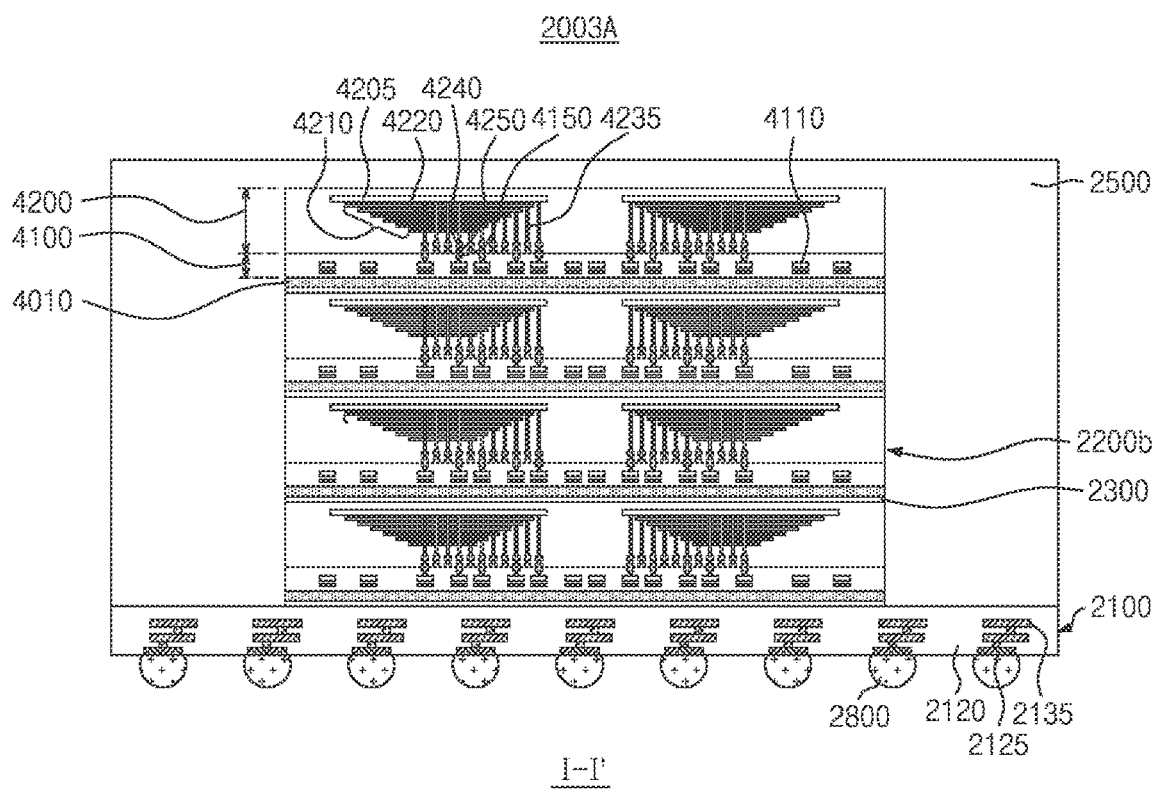

FIGS. 61 and 62 are sectional views schematically showing semiconductor packages according to exemplary embodiments of the disclosure. Each of FIGS. 61 and 62 explains an exemplary embodiment of the semiconductor package 2003 of FIG. 60, and conceptually shows an area of the semiconductor package 2003 taken along line I-I' in FIG. 60.

Referring to FIG. 61, in the semiconductor package 2003 according to the exemplary embodiments of the disclosure, the package substrate 2100 thereof may be a printed circuit board. The package substrate 2100 may include a package substrate body 2120, package upper pads ("2130" in FIG. 60) disposed at an upper surface of the package substrate body 2120, lower pads 2125 disposed at a lower surface of the package substrate body 2120 or exposed through the lower surface of the package substrate body 2120, and inner wirings 2135 electrically connecting the package upper pads ("2130" in FIG. 60) and the lower pads 2125 with each other within the package substrate body 2120. The package upper pads ("2130" in FIG. 60) may be electrically connected to connecting structures ("2400" in FIG. 60). The lower pads 2125 may be connected to the wiring patterns 2005 of the main substrate 2010 of the electronic system 2000 through conductive connectors 2800, as shown in FIG. 60.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 extending through the gate stack structure 3210, bit lines 3240 electrically connected to the memory channel structures 3220, and gate connecting wirings 3225 electrically connected to word lines ("WL" in FIG. 59) of the gate stack structure 3210.

The first structure 3100 may include the plurality of impurity regions ("25" in FIG. 1), the plurality of transistors ("27" in FIG. 1), and the plurality of peripheral circuit wiring layers ("31" in FIG. 1). The common source line 3205 may include the source line ("41" in FIG. 1). The gate stack structure 3210 may include the stack structure ("68" in FIG. 1). The memory channel structures 3220 may include the plurality of channel structures ("70" in FIG. 1). The bit lines 3240 may include the plurality of bit lines ("89" in FIG. 1). The gate connecting wirings 3235 may include the plurality of cell contact plugs ("83" in FIG. 1).

Each of the semiconductor chips 2200 may further include the plurality of dummy pillars 81 described with reference to FIGS. 1 to 58.

Each of the semiconductor chips 2200 may include a through wiring 3245 electrically connected to the peripheral wirings 3110 of the first structure 3100 while extending into the second structure 3200. Each of the semiconductor chips 2200 may be electrically connected to the peripheral wirings 3110 of the first structure 3100. The through wiring 3245 may be disposed outside the gate stack structure 3210, and may be further disposed to extend through the gate stack structure 3210. Each of the semiconductor chips 2200 may further include an input/output connecting wiring ("2210" in FIG. 60) electrically connected to the peripheral wirings 3110 of the first structure 3100.

Referring to FIG. 62, in a semiconductor package 2003A according to the exemplary embodiments of the disclosure, each of semiconductor chips 2200b thereof may include a semiconductor substrate 4010, a first structure 4100 on the semiconductor substrate 4010, and a second structure 4200 bonded to the first structure 4100 in a wafer bonding manner on the first structure 4100.

The first structure 4100 may include a peripheral circuit region including a peripheral wiring 4110 and first bonding structures 4150. The second structure 4200 may include a common source line 4205, a gate stack structure 4210 between the common source line 4205 and the first structure 4100, memory channel structures 4220 extending through the gate stack structure 4210, and second bonding structures 4250 electrically connected to the memory channel structures 4220 and word lines of the gate stack structure 4210 ("WL" in FIG. 59), respectively. For example, the second bonding structures 4250 may be electrically connected to the memory channel structures 4220 and the word lines ("WL" in FIG. 59) through bit lines 4240 electrically connected to the memory channel structures 4220 and gate connecting wirings 4235 electrically connected to the word lines ("WL" in FIG. 59), respectively. The first bonding structures 4150 of the first structure 4100 and the second bonding structures 4250 of the second structure 4200 may be bonded to each other while contacting each other. Bonding portions of the first bonding structures 4150 and the second bonding structures 4250 may be made of, for example, copper (Cu).

The first structure 4100 may include the plurality of impurity regions ("25" in FIG. 16), the plurality of transistors ("27" in FIG. 16), and the plurality of peripheral circuit wiring layers ("31" in FIG. 16). The common source line 4205 may include the source line ("41" in FIG. 16). The gate stack structure 4210 may include the stack structure ("68" in FIG. 16). The memory channel structures 4220 may include the plurality of channel structures ("70" in FIG. 16). The bit lines 4240 may include the plurality of bit lines ("89" in FIG. 16). The gate connecting wirings 4235 may include the plurality of cell contact plugs ("83" in FIG. 16).

Each of the semiconductor chips 2200b may further include the plurality of dummy pillars 81 described with reference to FIGS. 1 to 58.

Each of the semiconductor chips 2200b may further include an input/output pad ("2210" in FIG. 60) electrically connected to the peripheral wirings 4110 of the first structure 4100.

The semiconductor chips 2200 of FIG. 61 and the semiconductor chips 2200b of FIG. 62 may be electrically connected by bonding wire type connecting structures ("2400" in FIG. 60). Semiconductor chips in one semiconductor package such as the semiconductor chips 2200 of FIG. 61 and the semiconductor chips 2200b of FIG. 62 may be electrically connected by a connecting structure including a through-silicon via (TSV).

In accordance with the exemplary embodiments of the disclosure, a dummy pillar extending into a stack structure is provided. The dummy pillar includes an inactive pillar extending through a plurality of horizontal conductive layers, and at least one extension protruding from a side surface of the inactive pillar. The at least one extension is aligned with the plurality of horizontal conductive layers. The dummy pillar may function to prevent deformation of the stack structure. Semiconductor devices capable of preventing deformation of a multilayer structure and an electronic system including the semiconductor devices may be realized.

While the embodiments of the disclosure have been described with reference to the accompanying drawings, it should be understood by those skilled in the art that various transitions may be made without departing from the scope of the disclosure and without changing essential features thereof. Therefore, the above-described embodiments should be considered in a descriptive sense only and not for purposes of limitation.

What is claimed is:

1. A semiconductor device comprising:
   a stack structure comprising a plurality of mold layers and a plurality of horizontal conductive layers, which are alternately stacked;
   a channel structure vertically extending in the stack structure;
   a pillar structure vertically extending in the stack structure; and
   a plurality of contact plugs, each being connected to a corresponding one of the plurality of horizontal conductive layers,
   wherein each of the plurality of horizontal conductive layers comprises a gate electrode, and a connecting pad in continuity with the gate electrode,
   wherein the pillar structure comprises a pillar extending through the plurality of horizontal conductive layers, and a plurality of pillar extensions protruding from a side surface of the pillar,
   wherein the plurality of the pillar extensions comprise an uppermost extension and other pillar extensions,
   wherein outer side surfaces of the other pillar extensions further protrude beyond an outer side surface of the uppermost pillar extension,
   wherein each of the plurality of pillar extensions is horizontally aligned with a corresponding one of the plurality of horizontal conductive layers,
   wherein the channel structure vertically extends through a plurality of gate electrodes of the plurality of horizontal conductive layers, and
   wherein each of the plurality of contact plugs contacts a connecting pad of a corresponding one of the plurality of horizontal conductive layers.

2. The semiconductor device according to claim 1,
   wherein the plurality of pillar extensions of the pillar structure comprises:
   a first pillar extension contacting a first connecting pad among a plurality of connecting pads of the plurality of horizontal conductive layers; and
   a second pillar extension contacting a first gate electrode among the plurality of gate electrodes and being vertically spaced apart from the first pillar extension, and
   wherein the first gate electrode is vertically spaced apart from the first connecting pad.

3. The semiconductor device according to claim 2,
   wherein a horizontal width of the first pillar extension is smaller than a vertical thickness of the first pillar extension.

4. The semiconductor device according to claim 2,
   wherein the first pillar extension corresponds to the uppermost pillar extension and the second pillar extension corresponds to another pillar extension adjacent to the uppermost pillar extension, and
   wherein a horizontal width of the second pillar extension is greater than a horizontal width of the first pillar extension.

5. The semiconductor device according to claim 2,
   wherein a horizontal width of the second pillar extension is greater than a vertical thickness of the second pillar extension.

6. The semiconductor device according to claim 2, wherein:
   a vertical thickness of the first connecting pad is greater than a vertical thickness of the first gate electrode; and
   a vertical thickness of the first pillar extension is substantially equal to the vertical thickness of the first connecting pad.

7. The semiconductor device according to claim 2,
   wherein the plurality of mold layers includes a first mold layer which is disposed between the first pillar extension and the second pillar extension.

8. The semiconductor device according to claim 2,
   wherein the plurality of contact plugs includes a first contact plug which contacts the first connecting pad, and
   wherein the first pillar extension is spaced apart from the first contact plug.

9. The semiconductor device according to claim 2,
   wherein the plurality of contact plugs includes a first contact plug which contacts the first connecting pad, and
   wherein at least a portion of the second pillar extension vertically overlaps the first contact plug.

10. The semiconductor device according to claim 2,
    wherein the plurality of contact plugs includes a first contact plug which contacts the first connecting pad, and
    wherein the first contact plug extends through the first connecting pad, and extends into at least one of the plurality of mold layers.

11. The semiconductor device according to claim 2,
    wherein the plurality of contact plugs includes a first contact plug which contacts the first connecting pad, and
    wherein the first contact plug extends through the first connecting pad, extends through at least one of the plurality of mold layers, and extends into the second pillar extension.

12. The semiconductor device according to claim 1,
    wherein the plurality of pillar extensions include a first pillar extension which has a round side surface.

13. The semiconductor device according to claim 1,
    wherein the plurality of pillar extensions include a first pillar extension which has a smaller horizontal width at an upper surface thereof than at a central portion thereof.

14. The semiconductor device according to claim 1,
wherein the plurality of pillar extensions include a first pillar extension which is in continuity with the pillar, and is formed of a same material layer as the pillar.

15. The semiconductor device according to claim 1,
wherein the plurality of pillar extensions include a first pillar extension which comprises a material different from a material of the pillar.

16. The semiconductor device according to claim 1, further comprising:
a substrate comprising a cell area and a connection area,
wherein the stack structure is disposed on the cell area, and extends into the connection area,
wherein the channel structure is disposed on the cell area,
wherein the pillar structure is disposed on the connection area, and wherein the plurality of contact plugs are disposed on the connection area.

17. A semiconductor device comprising:
a substrate comprising a cell area and a connection area;
a source line on the substrate;
a stack structure comprising a plurality of mold layers and a plurality of horizontal conductive layers, which are alternately stacked on the source line;
a channel structure vertically extending through the stack structure on the cell area and extending into the source line;
a pillar structure vertically extending through the stack structure on the connection area and extending into the source line; and
a plurality of contact plugs disposed on the connection area, each contact plug being connected to a corresponding one of the plurality of horizontal conductive layers,
wherein each of the plurality of horizontal conductive layers comprises a gate electrode, and a connecting pad in continuity with the gate electrode,
wherein the pillar structure comprises a pillar extending through the plurality of horizontal conductive layers, and a plurality of pillar extensions protruding from a side surface of the pillar,
wherein the plurality of the pillar extensions comprise an uppermost extension and other pillar extensions,
wherein outer side surfaces of the other pillar extensions further protrude beyond bean outer side surface of the uppermost pillar extension,
wherein the plurality of pillar extensions include a first pillar extension which is in continuity with the pillar, and is formed of a same material layer as the pillar,
wherein each of the plurality of pillar extensions is horizontally aligned with a corresponding one of the plurality of horizontal conductive layers,
wherein the channel structure vertically extends through a plurality of gate electrodes of the plurality of horizontal conductive layers,
wherein each of the plurality of contact plugs contacts a connecting pad of a corresponding one of the plurality of horizontal conductive layers, and
wherein the stack structure is disposed on the cell area and extends into the connection area.

18. The semiconductor device according to claim 17,
wherein a lowermost end of the pillar is disposed at a level different from a level of a lowermost end of the channel structure.

* * * * *